US011229112B2

(12) United States Patent
Abe

(10) Patent No.: US 11,229,112 B2
(45) Date of Patent: Jan. 18, 2022

(54) EXTREME ULTRAVIOLET LIGHT GENERATION APPARATUS, TARGET CONTROL METHOD, AND ELECTRONIC DEVICE MANUFACTURING METHOD

(71) Applicant: Gigaphoton Inc., Tochigi (JP)

(72) Inventor: Toru Abe, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 17/227,912

(22) Filed: Apr. 12, 2021

(65) Prior Publication Data

US 2021/0349400 A1   Nov. 11, 2021

(51) Int. Cl.
*H05G 2/00* (2006.01)
*G03F 7/20* (2006.01)

(52) U.S. Cl.
CPC ......... *H05G 2/008* (2013.01); *G03F 7/70033* (2013.01); *G03F 7/70525* (2013.01)

(58) Field of Classification Search
CPC ............................ H05G 2/008; G03F 7/70033
See application file for complete search history.

(56) References Cited

U.S. PATENT DOCUMENTS

| | | | |
|---|---|---|---|
| 7,164,144 B2 | 1/2007 | Partlo et al. | |
| 8,809,823 B1* | 8/2014 | Senekerimyan | H05G 2/008 |
| | | | 250/504 R |
| 9,986,629 B2* | 5/2018 | Suzuki | H05G 2/005 |
| 2016/0370706 A1* | 12/2016 | Imachi | G03F 7/70033 |

* cited by examiner

*Primary Examiner* — Steven Whitesell Gordon
(74) *Attorney, Agent, or Firm* — Studebaker & Brackett PC

(57) ABSTRACT

An extreme ultraviolet light generation apparatus may include a target supply unit configured to output a target; an actuator configured to change a trajectory of the target; an illumination device configured to illuminate the target; a first trajectory sensor configured to detect the trajectory in a first direction; a second trajectory sensor configured to detect the trajectory in a second direction; and a processor configured, when the trajectory of the target is detected by the first trajectory sensor but is not detected by the second trajectory sensor, to perform a first search and determine whether or not to repeat the first search based on a signal intensity of the first trajectory sensor, the first search including changing the trajectory of the target into a third direction by controlling the actuator, and then determining whether or not the second trajectory sensor is capable of detecting the trajectory of the target.

20 Claims, 25 Drawing Sheets

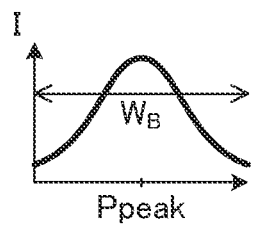
FIG. 3A
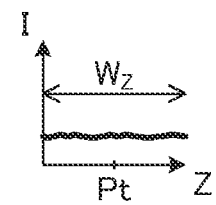
FIG. 3C
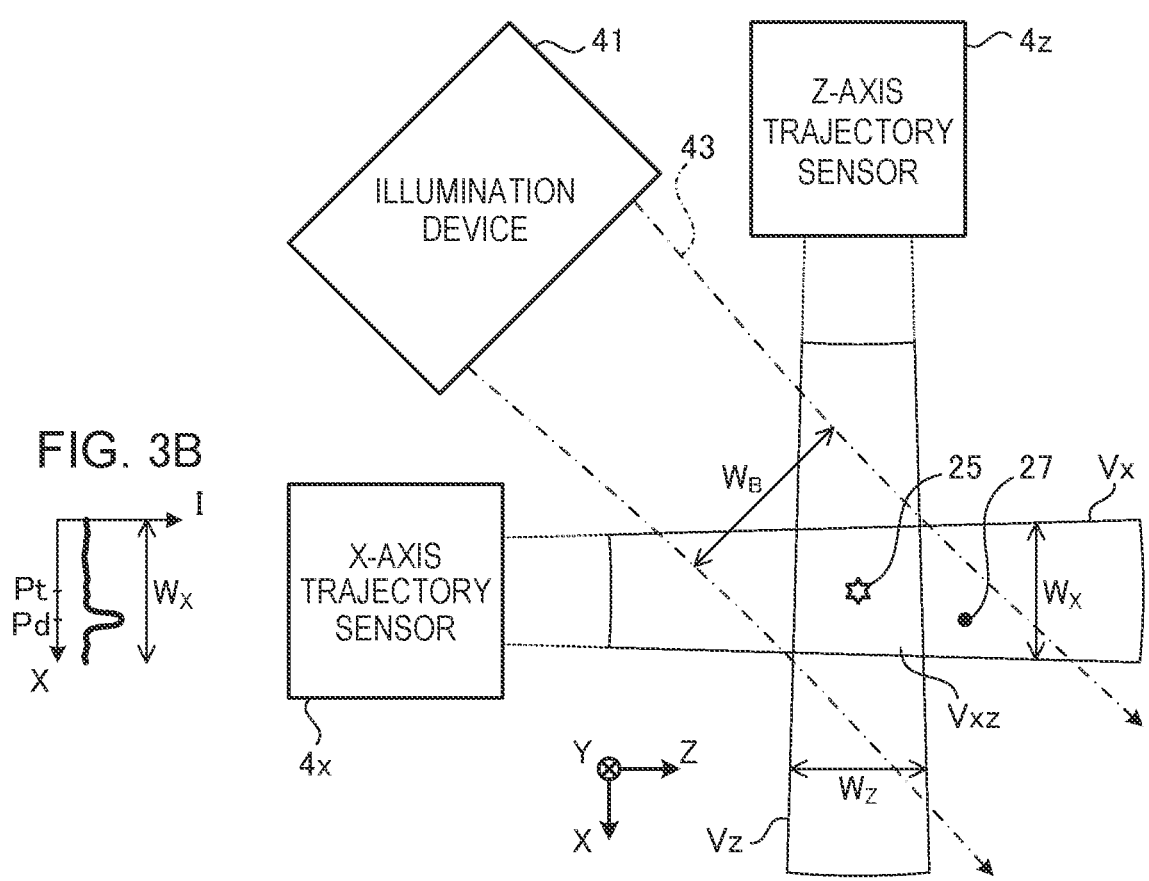
FIG. 3B
FIG. 3D

EXTREME ULTRAVIOLET LIGHT GENERATION APPARATUS, TARGET CONTROL METHOD, AND ELECTRONIC DEVICE MANUFACTURING METHOD

CROSS-REFERENCE TO RELATED APPLICATIONS

The application claims the benefit of Japanese Unexamined Patent Application No. 2020-082972, filed on May 11, 2020, the entire contents of which are hereby incorporated by reference.

BACKGROUND

1. Technical Field

The present disclosure relates to an extreme ultraviolet light generation apparatus, a target control method, and an electronic device manufacturing method.

2. Related Art

Recently, miniaturization of a transfer pattern in optical lithography of a semiconductor process has been rapidly proceeding along with miniaturization of the semiconductor process. In the next generation, microfabrication at 70 to 45 nm and further at 32 nm or less will be required. Therefore, in order to meet the demand for fine processing of, for example, 32 nm or less, the development of an exposure apparatus that combines an extreme ultraviolet (EUV) light generation apparatus that generates EUV light having a wavelength of about 13 nm and reduced projection reflection optics is expected.

As an EUV light generation apparatus, three types of apparatuses have been proposed: a laser produced plasma (LPP) type apparatus using plasma generated by irradiating a target substance with pulsed laser light, a discharge produced plasma (DPP) type apparatus using plasma generated by discharge, and a synchrotron radiation (SR) type apparatus using synchrotron radiation.

LIST OF DOCUMENTS

Patent Documents

Patent Document 1: U.S. Pat. No. 7,164,144
Patent Document 2: US Patent Application Publication No. 2016/0370706

SUMMARY

An extreme ultraviolet light generation apparatus according to an aspect of the present disclosure is an extreme ultraviolet light generation apparatus configured to generate extreme ultraviolet light by irradiating a target with laser light and includes a target supply unit configured to output the target; an actuator configured to change a trajectory of the target; an illumination device configured to illuminate the target; a first trajectory sensor configured to detect the trajectory of the target in a first direction; a second trajectory sensor configured to detect the trajectory of the target in a second direction being different from the first direction; and a processor configured, when the trajectory of the target is detected by the first trajectory sensor but is not detected by the second trajectory sensor, to perform a first search and determine whether or not to repeat the first search based on a signal intensity of the first trajectory sensor. Here, the first search includes changing the trajectory of the target into a third direction being different from the second direction by controlling the actuator, and then determining whether or not the second trajectory sensor is capable of detecting the trajectory of the target.

A target control method according to an aspect of the present disclosure with an extreme ultraviolet light generation apparatus configured to generate extreme ultraviolet light by irradiating a target with laser light includes determining whether or not a trajectory of the target is detected by a first trajectory sensor and a second trajectory sensor; and, when the trajectory of the target is detected by the first trajectory sensor but is not detected by the second trajectory sensor, performing a first search and determining whether or not to repeat the first search based on a signal intensity of the first trajectory sensor. Here, the first search includes changing the trajectory of the target into a third direction being different from a second direction by controlling an actuator, and then determining whether or not the second trajectory sensor is capable of detecting the trajectory of the target. The extreme ultraviolet light generation apparatus includes a target supply unit configured to output the target, the actuator configured to change the trajectory of the target, an illumination device configured to illuminate the target, the first trajectory sensor configured to detect the trajectory of the target in a first direction, and the second trajectory sensor configured to detect the trajectory of the target in the second direction being different from the first direction.

An electronic device manufacturing method according to an aspect of the present disclosure includes generating extreme ultraviolet light by irradiating a target with laser light using an extreme ultraviolet light generation apparatus, emitting the extreme ultraviolet light to an exposure apparatus, and exposing a photosensitive substrate to the extreme ultraviolet light in the exposure apparatus to manufacture an electronic device. Here, the extreme ultraviolet light generation apparatus includes a target supply unit configured to output the target; an actuator configured to change a trajectory of the target; an illumination device configured to illuminate the target; a first trajectory sensor configured to detect the trajectory of the target in a first direction; a second trajectory sensor configured to detect the trajectory of the target in a second direction being different from the first direction; and a processor configured, when the trajectory of the target is detected by the first trajectory sensor but is not detected by the second trajectory sensor, to perform a first search and determine whether or not to repeat the first search based on a signal intensity of the first trajectory sensor. The first search includes changing the trajectory of the target into a third direction being different from the second direction by controlling the actuator, and then determining whether or not the second trajectory sensor is capable of detecting the trajectory of the target.

BRIEF DESCRIPTION OF THE DRAWINGS

Embodiments of the present disclosure will be described below merely as examples with reference to the accompanying drawings.

FIG. 3A illustrates an exemplary beam profile in the vicinity of a concentration position of illumination light output from an illumination device.

FIG. 3B illustrates an exemplary light intensity distribution extracted along the X axis from a part of an image acquired by an X-axis trajectory sensor.

FIG. 3C illustrates an exemplary light intensity distribution extracted along the Z axis from a part of an image acquired by a Z-axis trajectory sensor.

FIG. 3D schematically illustrates arrangement of the X-axis trajectory sensor, the Z-axis trajectory sensor, and the illumination device as viewed in the +Y direction.

DESCRIPTION OF EMBODIMENTS

Figure 1:
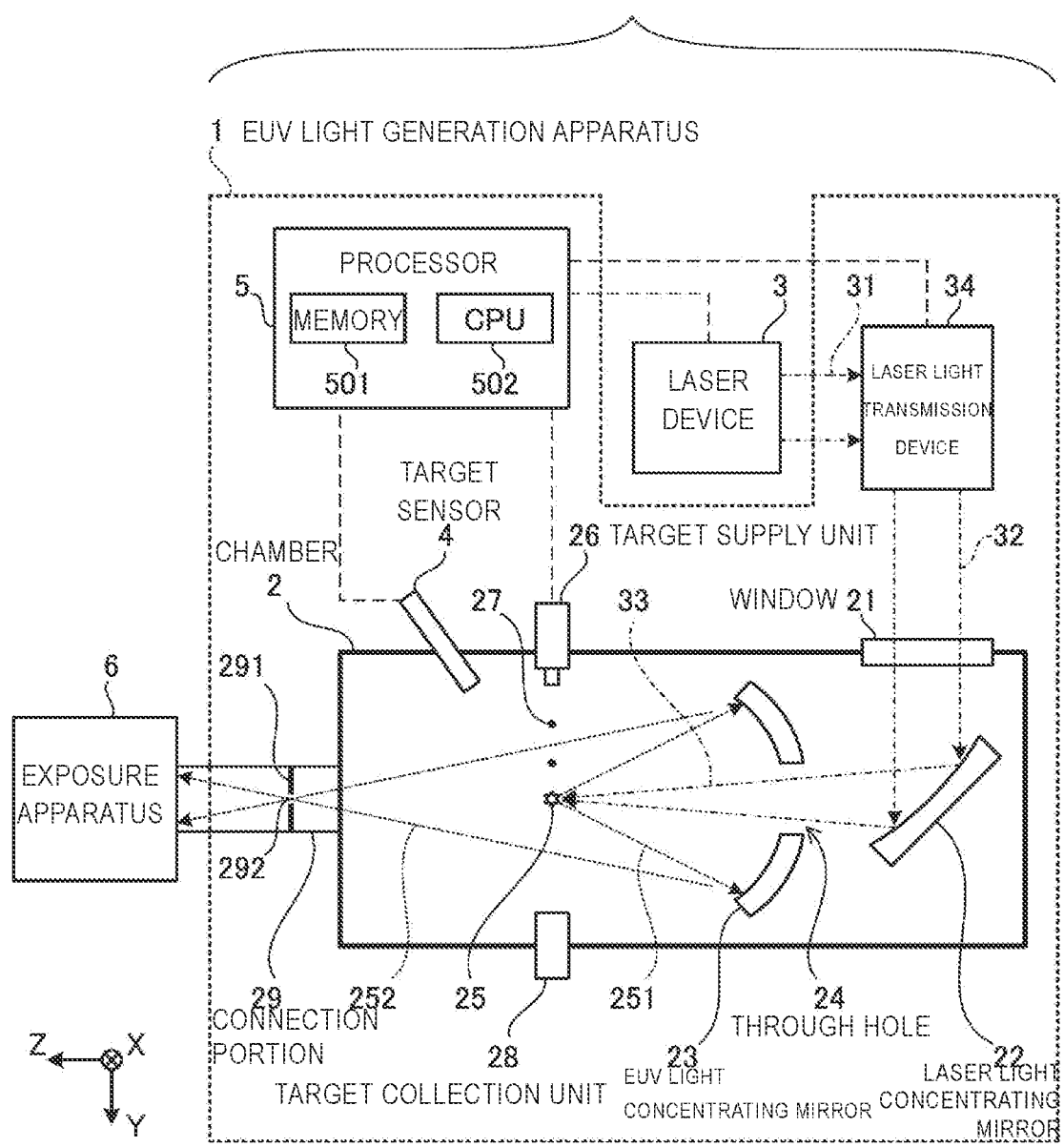
FIG. 1 schematically illustrates an exemplary configuration of an LPP EUV light generation system.

<Contents>
1. Overall description of EUV light generation system
   1.1 Configuration
   1.2 Operation
2. Comparative Example
   2.1 Configuration
   2.2 Operation
   2.3 Problem
3. EUV light generation apparatus performing detection adjustment on one detection axis when trajectory T is detected only on other detection axis
   3.1 Main flow
   3.2 First search
   3.3 Second search
   3.4 When either one of flags becomes invalid
   3.5 Effect
4. EUV light generation apparatus performing second search after continuously performing first search
   4.1 Operation
   4.2 Effect
5. EUV light generation apparatus determining threshold using signal intensity at initial position as reference value
   5.1 Operation
   5.2 Effect
6. EUV light generation apparatus updating reference value
   6.1 Operation
   6.2 Effect
7. EUV light generation apparatus using average value
   7.1 Operation
   7.2 Effect
8. Others Hereinafter, embodiments of the present disclosure will be described in detail with reference to the drawings. The embodiments described below illustrate some examples of the present disclosure and do not limit the contents of the present disclosure. Also, all configurations and operation described in the embodiments are not necessarily essential as configurations and operation of the present disclosure. Here, the same components are denoted by the same reference numerals, and duplicate description thereof is omitted.

1. Overall Description of EUV Light Generation System 1.1 Configuration

FIG. 1 schematically illustrates an exemplary configuration of an LPP EUV light generation system 11. An EUV light generation apparatus 1 is used with a laser device 3. In the present disclosure, a system including the EUV light generation apparatus 1 and the laser device 3 is referred to as an EUV light generation system 11. The EUV light generation apparatus 1 includes a chamber 2 and a target supply unit 26. The chamber 2 is a sealable container. The target supply unit 26 supplies a target substance into the chamber 2. The material of the target substance may include tin, terbium, gadolinium, lithium, xenon, or a combination of any two or more thereof.

A through hole is formed in a wall of the chamber 2. The through hole is blocked by a window 21 through which pulsed laser light 32 emitted from the laser device 3 passes. An EUV light concentrating mirror 23 having a spheroidal reflection surface is disposed inside the chamber 2. The EUV light concentrating mirror 23 has first and second focal points. A multilayer reflection film in which molybdenum and silicon are alternately stacked is formed on a surface of the EUV light concentrating mirror 23. The EUV light concentrating mirror 23 is disposed such that the first focal point is located in a plasma generation region 25 and the second focal point is located at an intermediate focal point 292. A through hole 24 is formed at the center of the EUV light concentrating mirror 23, and pulsed laser light 33 passes through the through hole 24.

The EUV light generation apparatus 1 includes a processor 5, a target sensor 4, and the like. The processor 5 is a processing device including a memory 501 in which a control program is stored, and a central processing unit (CPU) 502 for executing the control program. The processor 5 is specifically configured or programmed to perform various processes included in the present disclosure. The target sensor 4 detects at least one of the presence, trajectory, position, and velocity of a target 27. The target sensor 4 may have an imaging function.

Further, the EUV light generation apparatus 1 includes a connection portion 29 providing communication between an internal space of the chamber 2 and an internal space of the exposure apparatus 6. A wall 291 in which an aperture is formed is disposed inside the connection portion 29. The wall 291 is arranged such that the aperture is located at the second focal point of the EUV light concentrating mirror 23.

Furthermore, the EUV light generation apparatus 1 includes a laser light transmission device 34, a laser light concentrating mirror 22, a target collection unit 28 for collecting the target 27, and the like. The laser light transmission device 34 includes an optical element for defining a transmission state of laser light, and an actuator for adjusting the position, posture or the like of the optical element.

1.2 Operation

Operation of the EUV light generation system 11 will be described with reference to FIG. 1. Pulsed laser light 31 emitted from the laser device 3 enters, via the laser light transmission device 34, the chamber 2 through the window 21 as the pulsed laser light 32. The pulsed laser light 32 travels along a laser light path in the chamber 2, is reflected by the laser light concentrating mirror 22, and is radiated to the target 27 as the pulsed laser light 33.

The target supply unit 26 outputs the target 27 containing the target substance toward the plasma generation region 25 in the chamber 2. The target 27 is irradiated with the pulsed laser light 33. The target 27 irradiated with the pulsed laser light 33 is turned into plasma, and radiation light 251 is radiated from the plasma. The EUV light contained in the radiation light 251 is reflected by the EUV light concentrating mirror 23 with a higher reflectivity than light in other wavelength ranges. Reflection light 252 including the EUV light reflected by the EUV light concentrating mirror 23 is concentrated at the intermediate focal point 292 and emitted to the exposure apparatus 6. Here, one target 27 may be irradiated with a plurality of pulses included in the pulsed laser light 33.

The processor 5 controls the entire EUV light generation system 11. The processor 5 processes a detection result of the target sensor 4. Based on the detection result of the target sensor 4, the processor 5 controls timing at which the target 27 is output, an output direction of the target 27, and the like. Further, the processor 5 controls oscillation timing of the laser device 3, a travel direction of the pulsed laser light 32, the concentration position of the pulsed laser light 33, and the like. Such various kinds of control described above are merely exemplary, and other control may be added as necessary.

2. Comparative Example 2.1 Configuration

Figure 2:
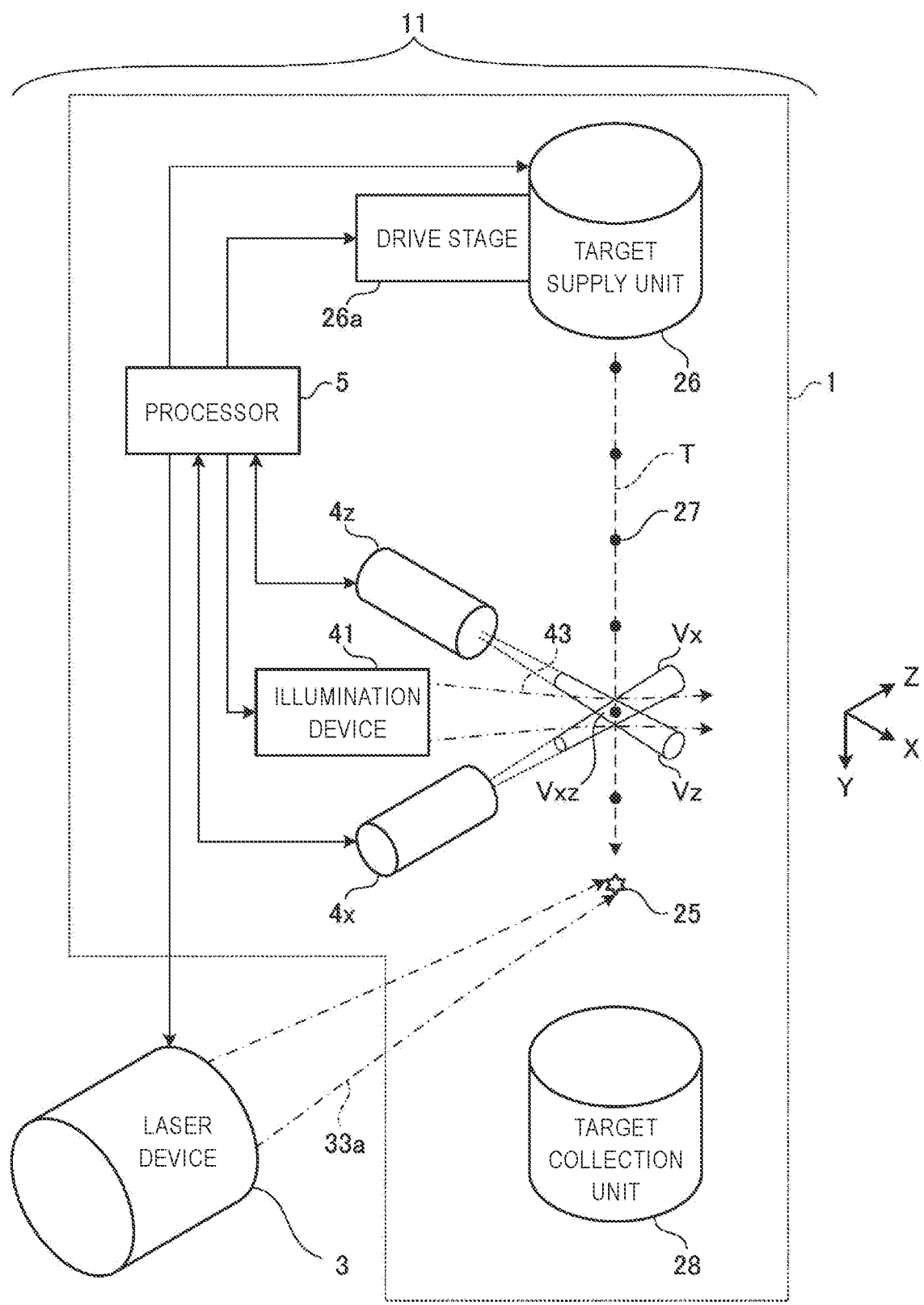
FIG. 2 schematically illustrates a part of an EUV light generation system according to a comparative example.

FIG. 2 schematically illustrates a part of the EUV light generation system 11 according to a comparative example. The comparative example of the present disclosure is an example recognized by the applicant as known only by the applicant, and is not a publicly known example admitted by the applicant. In FIG. 2, the chamber 2, the laser light concentrating mirror 22, the EUV light concentrating mirror 23, the laser light transmission device 34, and the like are omitted. As illustrated in FIG. 2, the EUV light generation apparatus 1 of the comparative example includes an X-axis trajectory sensor 4$x$, a Z-axis trajectory sensor 4$z$, an illumination device 41, and a drive stage 26$a$.

The output direction of a plurality of the targets 27 output from the target supply unit 26 represents the +Y direction. The travel direction of laser light 33$a$ radiated to the target 27 represents the +Z direction. The +Y direction and the +Z direction are perpendicular to each other. Directions perpendicular to both the +Y direction and the +Z direction represent the +X direction and the −X direction. Each of the plurality of targets 27 is in the form of a droplet. The laser light 33$a$ is a pulsed laser light emitted from the laser device 3.

Each of the X-axis trajectory sensor 4$x$ and the Z-axis trajectory sensor 4$z$ includes, for example, an imaging device. Each of the X-axis trajectory sensor 4$x$ and the Z-axis trajectory sensor 4$z$ is configured to generate image data by imaging a target 27 moving toward the plasma generation region 25 from the target supply unit 26.

The X-axis trajectory sensor 4$x$ is disposed at a position substantially in the −Z direction when viewed from the trajectory T of the target 27, and detects the trajectory T of the target 27 from the position in the −Z direction. When the position of the trajectory T of the target 27 is changed in the +X direction or the −X direction, the position of the image of the target 27 in the image acquired by the X-axis trajectory sensor 4$x$ moves in the +X direction or the −X direction. Therefore, the processor 5 can calculate a detection position Pd on the X axis of the trajectory T of the target 27 based on the image data output from the X-axis trajectory sensor 4$x$. That is, the X-axis trajectory sensor 4$x$ has a detection axis parallel to the X axis.

The Z-axis trajectory sensor 4$z$ is disposed at a position substantially in the −X direction when viewed from the trajectory T of the target 27, and detects the trajectory T of the target 27 from the position in the −X direction. When the position of the trajectory T of the target 27 is changed in the +Z direction or the −Z direction, the position of the image of the target 27 in the image acquired by the Z-axis trajectory sensor 4$z$ moves in the +Z direction or the −Z direction. Therefore, the processor 5 can calculate the detection position Pd on the Z axis of the trajectory T of the target 27 based on the image data output from the Z-axis trajectory sensor 4$z$. That is, the Z-axis trajectory sensor 4$z$ has a detection axis parallel to the Z axis.

Each of the X-axis trajectory sensor 4$x$ and the Z-axis trajectory sensor 4$z$ is arranged to image the target 27 in the vicinity of the plasma generation region 25, for example, the target 27 just before reaching the plasma generation region 25. A detection range Vx of the X-axis trajectory sensor 4$x$ and a detection range Vz of the Z-axis trajectory sensor 4$z$ are defined by the angle of view and the depth of focus determined by the optical system of the sensors. The detection range Vx of the X-axis trajectory sensor 4$x$ and the detection range Vz of the Z-axis trajectory sensor 4$z$ overlap to each other at a space Vxz. Each of the X-axis trajectory sensor 4$x$ and the Z-axis trajectory sensor 4$z$ is aligned so that the ideal trajectory of the target 27 from the target supply unit 26 toward the plasma generation region 25 penetrates substantially the center of the space Vxz.

The illumination device 41 is a laser device for illuminating the target 27 with illumination light 43 being laser light. The space Vxz is included in the optical path of the illumination light 43.

The drive stage 26a is connected to the target supply unit 26. The drive stage 26a includes an actuator (not illustrated). The drive stage 26a is configured to change the trajectory T of the target 27 by changing the position or orientation of the target supply unit 26 with respect to the plasma generation region 25. For example, when the drive stage 26a is a two-axis stage, the drive stage 26a can change the trajectory T of the target 27 in the X-axis direction and the Z-axis direction by moving the position of the target supply unit 26 in the X-axis direction and the Z-axis direction.

2.2 Operation

The illumination device 41 generates the illumination light 43 under control of the processor 5. When the target 27 passes through the space Vxz, the target 27 is illuminated with the illumination light 43.

Each of the X-axis trajectory sensor 4x and the Z-axis trajectory sensor 4z receives a part of the illumination light 43 reflected by the target 27. Each of the X-axis trajectory sensor 4x and the Z-axis trajectory sensor 4z images the target 27 illuminated by the illumination light 43 to generate image data, and outputs the image data to the processor 5. The timing of the imaging by the X-axis trajectory sensor 4x and the Z-axis trajectory sensor 4z is controlled by the processor 5.

The processor 5 receives the image data from the X-axis trajectory sensor 4x and the Z-axis trajectory sensor 4z, and calculates a detection position Pd of the trajectory T of the target 27 in each of the X axis and the Z axis.

The processor 5 controls the drive stage 26a based on the detection position Pd in each of the X axis and the Z axis and a target position Pt in each of the X axis and the Z axis. That is, the processor 5 controls the drive stage 26a in the X-axis direction and the Z-axis direction so that the trajectory T of the target 27 approaches the target position Pt in each of the X axis and the Z axis. When the drive stage 26a changes the position or posture of the target supply unit 26, the trajectory T of the target 27 output thereafter is changed. Thus, the trajectory T of the target 27 is controlled so that the target 27 reaches the plasma generation region 25.

The laser device 3 may include a prepulse laser device and a main pulse laser device (not illustrated). Prepulse laser light emitted from the prepulse laser device is radiated to the target 27 and diffuse the target 27 to generate a diffusion target. Main pulse laser light emitted from the main pulse laser device is radiated to the diffusion target to turn the target substance contained in the diffusion target into plasma. One target 27 may be irradiated sequentially with a plurality of the prepulse laser light from a plurality of the prepulse laser devices (not illustrated).

The X-axis trajectory sensor 4x or the Z-axis trajectory sensor 4z outputs a passage timing signal indicating timing at which the target 27 passes through a predetermined position in the Y axis. The processor 5 controls the laser device 3 to emit the laser light 33a based on the passage timing signal. Further, the processor 5 adjusts the concentration position of the laser light 33a in the Y axis by controlling the actuator of the laser light transmission device 34 based on the passage timing signal.

In addition, the processor 5 controls the actuator of the laser light transmission device 34 based on the detection position Pd of the trajectory T of the target 27 on the X axis, thereby adjusting the concentration position of the laser light 33a in the X axis.

2.3 Problem

FIG. 3A illustrates an exemplary beam profile in the vicinity of the concentration position of the illumination light 43 emitted from the illumination device 41. The beam profile is a light intensity distribution in a cross section substantially perpendicular to the travel direction of the light. The vertical axis of FIG. 3A represents the light intensity I. The illumination light 43 has a beam profile in a substantially Gaussian distribution.

The concentration position of the illumination light 43 is adjusted to approximately coincide with the position of the space Vxz. The beam width WB at the concentration position of the illumination light 43 is set so that the space Vxz is included in the optical path of the illumination light 43. Further, the concentration position of the illumination light 43 is adjusted such that a position Ppeak of the peak of the light intensity distribution located at the center of the beam profile of the illumination light 43 coincides with a part of the ideal trajectory of the target 27 moving from the target supply unit 26 toward the plasma generation region 25. In this case, when the target 27 travels along the ideal trajectory, the target 27 is illuminated most brightly, and the contrast of the image acquired by each of the X-axis trajectory sensor 4x and the Z-axis trajectory sensor 4z is highest.

FIG. 3B illustrates an exemplary light intensity distribution extracted along the X axis from a part of the image acquired by the X-axis trajectory sensor 4x. The horizontal axis of FIG. 3B represents the light intensity I. The dimension of the detection range Vx of the X-axis trajectory sensor 4x along the X axis is indicated by WX. As illustrated in FIG. 3B, when there is a steep peak in a part of the light intensity distribution, the peak is considered to be caused by the illumination light 43 reflected by the target 27. Therefore, the position of the peak can be set as the detection position Pd of the trajectory T of the target 27 on the X axis. For example, when the detection position Pd is shifted from the target position Pt in the +X direction, the trajectory T of the target 27 can be brought close to the target position Pt by controlling the drive stage 26a in the −X direction.

FIG. 3C illustrates an exemplary light intensity distribution extracted along the Z axis from a part of the image acquired by the Z-axis trajectory sensor 4z. The vertical axis of FIG. 3C represents the light intensity I. The dimension of the detection range Vz of the Z-axis trajectory sensor 4z along the Z axis is indicated by WZ.

FIG. 3D schematically illustrates arrangement of the X-axis trajectory sensor 4x, the Z-axis trajectory sensor 4z, and the illumination device 41 as viewed in the +Y direction. As described above, when the target 27 travels along the ideal trajectory T, the target 27 passes through the space Vxz.

However, there may be a case that the target 27 does not pass through the space Vxz. For example, as illustrated in FIG. 3D, when the target 27 passes through a position outside the detection range Vz of the Z-axis trajectory sensor 4z, the image of the target 27 is not included in the image acquired by the Z-axis trajectory sensor 4z. Therefore, the light intensity distribution extracted along the Z axis has no clear peak, as illustrated in FIG. 3C. In this case, the processor 5 cannot calculate the detection position Pd of the trajectory T of the target 27 on the Z axis. In such a case, it is not clear whether the drive stage 26a should be controlled in the +Z direction or in the −Z direction.

As a countermeasure for a case where the trajectory T of the target 27 cannot be detected in one of the two detection axes, it is conceivable to determine that the target supply unit 26 is in an abnormal output state. In this case, the processor 5 stops the control for the target supply unit 26 to output the target 27, and issues a trajectory detection error. The operator who recognizes the trajectory detection error readjusts the target supply unit 26 so that the target 27 is normally output. After the readjustment, a start-up process of the EUV light generation apparatus 1 is performed, and then the target 27 can be output. When the readjustment and start-up process described above are required, the operation time of the EUV light generation apparatus 1 is shortened, and the productivity is decreased.

Even when the trajectory T cannot be detected in one of the two detection axes, the trajectory T may be detected in the other detection axis. For example, when the following two conditions are satisfied, the trajectory T of the target 27 in the X-axis direction can be detected.

(1) The trajectory T is included in the detection range Vx of the X-axis trajectory sensor 4x.

(2) The trajectory T is included in the optical path of the illumination light 43.

Even when the trajectory T cannot be detected in one of the two detection axes, if the trajectory T is detected in the other detection axis, it is understood that at least outputting of the target 27 has been performed. In the embodiment described below, detection adjustment is performed under condition that the trajectory T is detected by one of the X-axis trajectory sensor 4x and the Z-axis trajectory sensor 4z and the trajectory T is not detected by the other thereof. Thus, there is a possibility that the EUV light generation apparatus 1 can be operated without readjustment and the start-up process by an operator.

Figure 4:
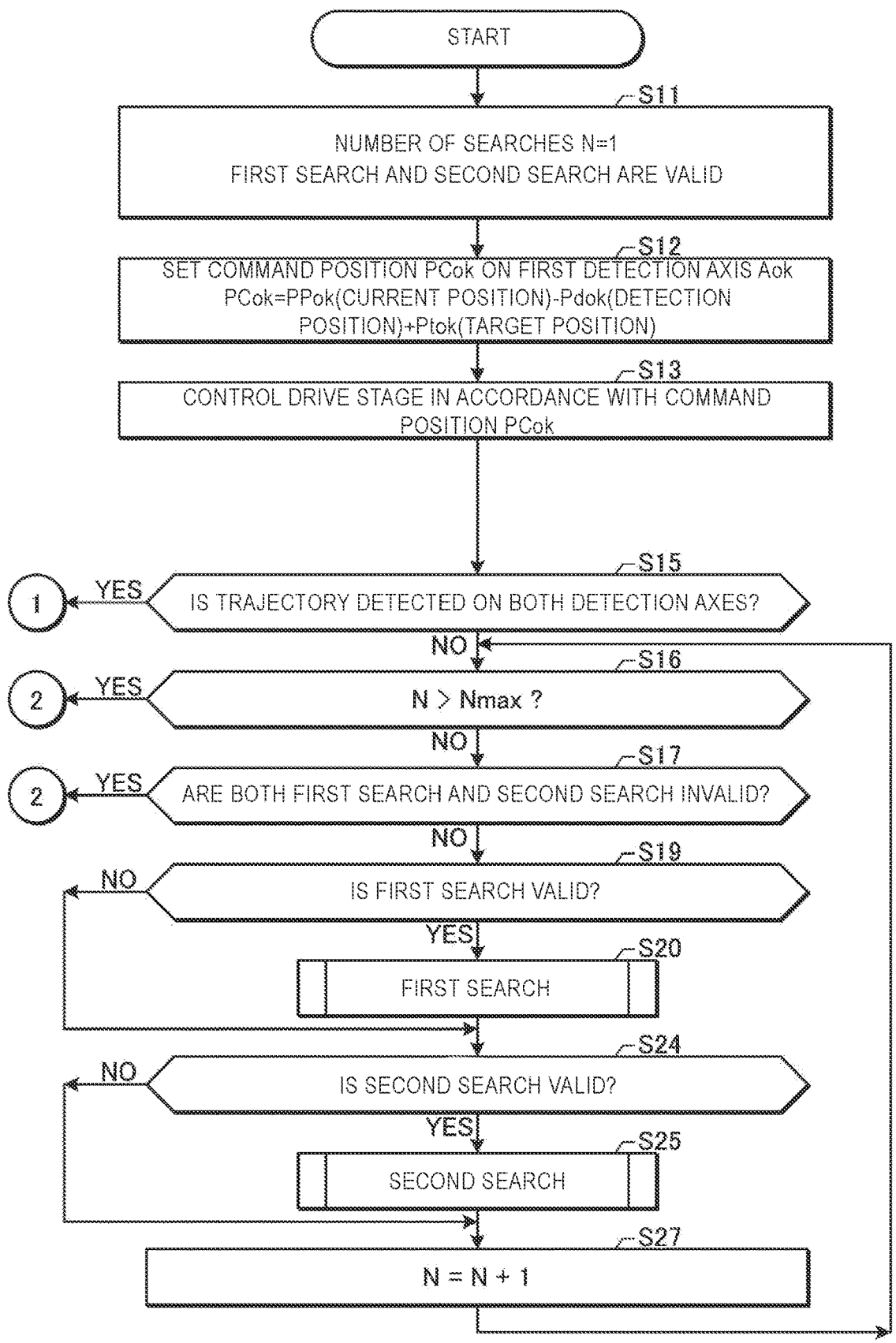
FIG. 4 is a flowchart illustrating operation of a main part of detection adjustment in a first embodiment.
Figure 5:
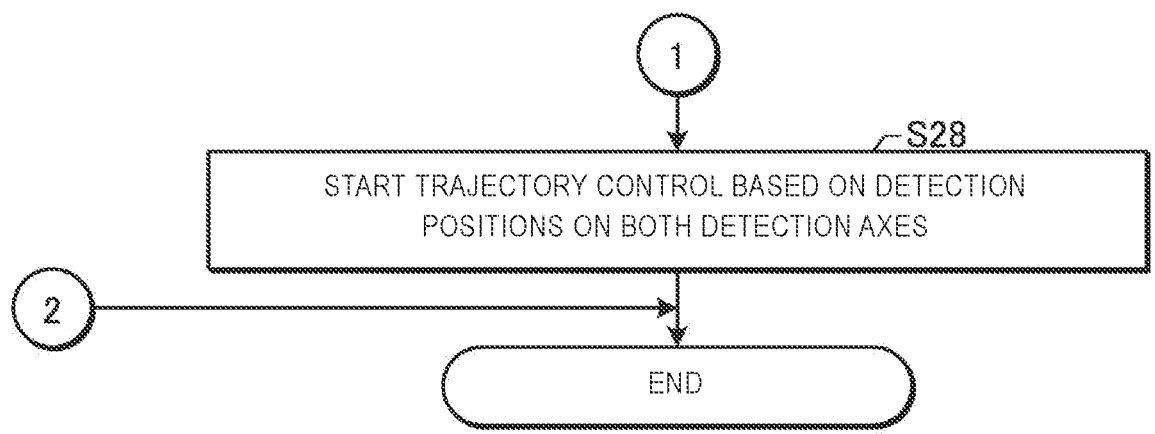
FIG. 5 is a flowchart illustrating end operation of the detection adjustment in the first embodiment.

3. EUV Light Generation Apparatus Performing Detection Adjustment on One Detection Axis when Trajectory T is Detected Only on Other Detection Axis 3.1 Main Flow FIG. 4 is a flowchart illustrating operation of a main part of the detection adjustment in a first embodiment. FIG. 5 is a flowchart illustrating end operation of the detection adjustment in the first embodiment. The structural configuration of the EUV light generation apparatus 1 according to the first embodiment is the same as the configuration of the comparative example described referring to FIGS. 2 and 3A to 3D.

The detection adjustment illustrated in FIG. 4 is performed by the processor 5. The timing at which the detection adjustment illustrated in FIG. 4 is performed is, for example, immediately after the start of the operation of the target supply unit 26. For example, when the target substance contains tin, the detection adjustment illustrated in FIG. 4 is performed immediately after the inside of the container of molten tin is pressurized and outputting of the target 27 is started. The detection adjustment illustrated in FIG. 4 is performed when one of the X-axis trajectory sensor 4x and the Z-axis trajectory sensor 4z detects the trajectory T of the target 27 and the other thereof does not detect the trajectory T of the target 27.

In the following description, the detection axis on which the trajectory T is detected is referred to as a first detection axis Aok. A detection axis on which the trajectory T is not detected is defined as a second detection axis Ang. One of the X axis and the Z axis corresponds to the first detection axis Aok, and the other thereof corresponds to the second detection axis Ang. In the examples illustrated in FIGS. 3A to 3D, the X axis corresponds to the first detection axis Aok, and the Z axis corresponds to the second detection axis Ang. Also, one of the X-axis trajectory sensor 4x and the Z-axis trajectory sensor 4z corresponds to a first trajectory sensor in the present disclosure, and the other thereof corresponds to a second trajectory sensor in the present disclosure. In the example illustrated in FIGS. 3A to 3D, the X-axis trajectory sensor 4x that detects the trajectory T corresponds to the first trajectory sensor in the present disclosure, and the Z-axis trajectory sensor 4z that does not detect the trajectory T corresponds to the second trajectory sensor in the present disclosure. The −Z direction in which the X-axis trajectory sensor 4x that detects the trajectory T is located corresponds to a first direction in the present disclosure, and the −X direction in which the Z-axis trajectory sensor 4z that does not detect the trajectory T is located corresponds to a second direction in the present disclosure.

In the detection adjustment illustrated in FIG. 4, the processor 5 performs the detection adjustment so that the trajectory T of the target 27 can be detected not only on the first detection axis Aok on which the trajectory T is detected but also on the second detection axis Ang on which the trajectory T is not detected. The detection adjustment includes controlling the drive stage 26a to change the position of the trajectory T on the second detection axis Ang and determining whether the trajectory T of the target 27 can be detected on the second detection axis Ang.

FIGS. 9A to 9M illustrate a specific example of the detection adjustment in the first embodiment.

Figure 9A:
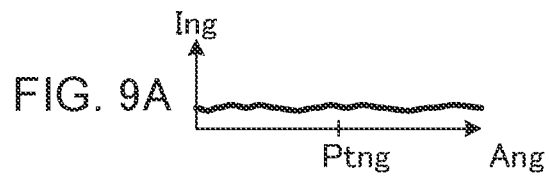
FIGS. 9A to 9M illustrate a specific example of detection adjustment in the first embodiment.
Figure 9B:
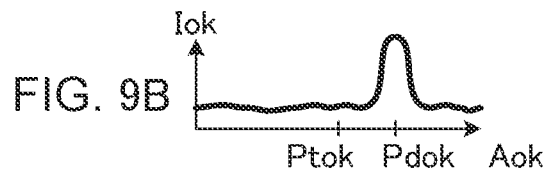
Figure 9C:
Figure 9D:
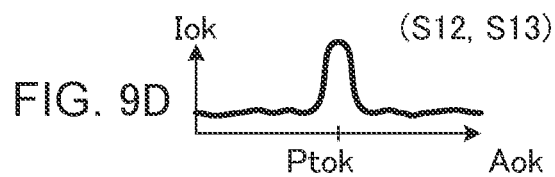
Figure 9E:
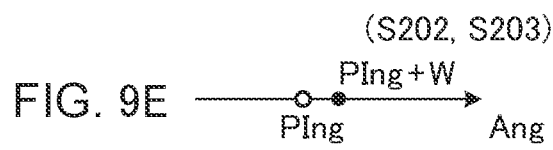
Figure 9F:
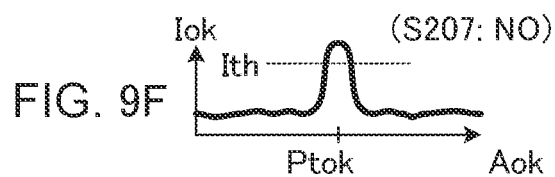
Figure 9G:
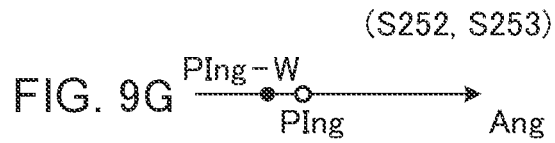
Figure 9H:
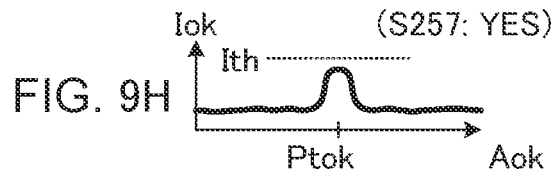
Figure 9I:
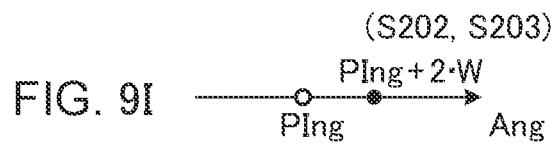
Figure 9J:
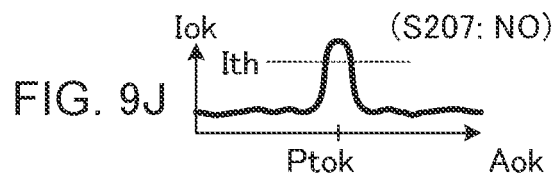
Figure 9K:
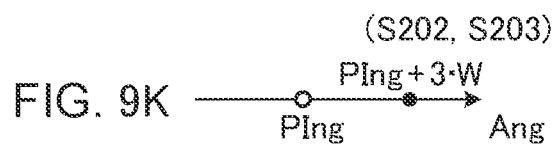
Figure 9L:
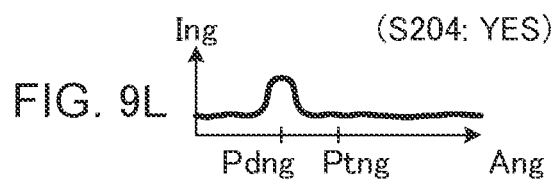
Figure 9M:
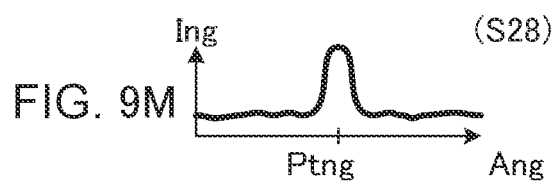

Each of FIGS. 9A, 9L, and 9M illustrates an exemplary light intensity distribution extracted along the second detection axis Ang from a part of an image acquired by the trajectory sensor that does not detect the trajectory T.

Each of FIGS. 9B, 9D, 9F, 9H, and 9J illustrates an exemplary light intensity distribution extracted along the first detection axis Aok from a part of an image acquired by the trajectory sensor that detects the trajectory T.

FIG. 9C illustrates an exemplary initial position PIng in the second detection axis Ang.

Each of FIGS. 9E, 9G, 9I, and 9K illustrates an exemplary initial position PIng and a command position PCng in the second detection axis Ang.

At the beginning of the processing illustrated in FIG. 4, the light intensity distribution on the first detection axis Aok has a peak indicating the detection position Pdok of the trajectory T as illustrated in FIG. 9B, but the light intensity distribution on the second detection axis Ang does not have a clear peak as illustrated in FIG. 9A.

In S11 of FIG. 4, the processor 5 sets the number of searches N to an initial value 1. Further, the processor 5 sets flags indicating that processing of a first search and processing of a second search described later are valid.

Next, in S12, the processor 5 sets the command position PCok on the first detection axis Aok by following Equation (1).

$$PCok = PPok - Pdok + Ptok \quad (1)$$

In Equation (1), the command position PCok is a command position for the processor 5 to control the drive stage 26a. PPok is the current position of the drive stage 26a. The command position PCok and the current position Ppok have values defined in the coordinate system of the drive stage 26a. That is, the current position PPok specifies where the drive stage 26a is located in its movable range. The command position PCok specifies to which position in the movable range the drive stage 26a is controlled.

In Equation (1), Pdok is the detection position of the trajectory T of the target 27 detected by the X-axis trajectory sensor 4x or the Z-axis trajectory sensor 4z. Ptok is the target position of the trajectory T of the target 27. The detection position Pdok and the target position Ptok have values defined in the coordinate system of the X-axis trajectory sensor 4x or the Z-axis trajectory sensor 4z. That is, the detection position Pdok is specified from the image acquired by the X-axis trajectory sensor 4x or the Z-axis trajectory sensor 4z. The X-axis trajectory sensor 4x or the Z-axis trajectory sensor 4z is aligned, for example, such that the center position of each detection range coincides with the target position Ptok.

The coordinate system of the drive stage 26a does not necessarily coincide with the coordinate system of the X-axis trajectory sensor 4x or the Z-axis trajectory sensor 4z. For example, even when the command position PCok is set at the center position of the movable range of the drive stage 26a, the trajectory T of the target 27 does not necessarily pass through the center position of the detection range of the X-axis trajectory sensor 4x or the Z-axis trajectory sensor 4z.

In the following description, it is assumed that the coordinate system of the drive stage 26a and the coordinate system of the X-axis trajectory sensor 4x or the Z-axis trajectory sensor 4z have the same scale. For example, when the drive stage 26a is controlled by the command position PCok obtained by adding a predetermined amount Δx to the current position PPok, each coordinate system is set so that the movement amount of the detection position Pdok detected by the X-axis trajectory sensor 4x coincides with the predetermined amount Δx. When the scales are not the same, the command position PCok and the like are calculated after conversion according to the scales.

In FIG. 9B, an example of the detection position Pdok and the target position Ptok on the first detection axis Aok is illustrated. The command position PCok for bringing the trajectory T of the target 27 closer to the target position Ptok is calculated by adding the difference between the target position Ptok and the detection position Pdok to the current position PPok of the drive stage 26a.

The command position PCok, the current position PPok, the detection position Pdok, and the target position Ptok are defined on the first detection axis Aok. Similarly, a command position PCng, a current position PPng, a detection position Pdng, and a target position Ptng, which will be described later, are defined on the second detection axis Ang as well.

Next, in S13, the processor 5 controls the drive stage 26a in accordance with the set command position PCok.

FIG. 9D illustrates an exemplary light intensity distribution after the drive stage 26a is controlled along the first detection axis Aok. As described above, the position Ppeak of the peak of the light intensity distribution of the illumination light 43 coincides with a part of the ideal trajectory of the target 27. Therefore, if the drive stage 26a is controlled in S12 and S13 so that the trajectory T of the target 27 detected on the first detection axis Aok approaches the target position Pt, the target 27 is brightly illuminated in the subsequent process. Then, the contrast of the images acquired by the X-axis trajectory sensor 4x and the Z-axis trajectory sensor 4z increases. This makes it possible to more accurately detect the trajectory T of the target 27.

Next, in S15, the processor 5 determines whether or not the trajectory T of the target 27 can be detected on both detection axes including not only the first detection axis Aok but also the second detection axis Ang.

When the control of the drive stage 26a in S13 enables the detection of the trajectory T on both the detection axes (S15: YES), the processor 5 advances processing to S28 of FIG. 5. In S28 in FIG. 5, the processor 5 starts the trajectory control based on the detection positions Pdok and Pdng on both the detection axes. For example, the processor 5 controls the drive stage 26a so that the detection position Pdok of the trajectory T detected by the X-axis trajectory sensor 4x and the detection position Pdng of the trajectory T detected by the Z-axis trajectory sensor 4z approach the respective target positions Ptok and Ptng. After S28, the processor 5 ends processing of the detection adjustment, but outputting of the target 27 and the trajectory control continue thereafter.

When the trajectory T cannot be detected on the second detection axis Ang (S15: NO), the processor 5 advances processing to S16.

In S16, the processor 5 determines whether or not the number of searches N exceeds an upper limit value Nmax.

When the number of searches N exceeds the upper limit value Nmax (S16: YES), the processor 5 ends processing of the detection adjustment (see FIG. 5). In this case, the processor 5 may stop outputting of the target 27 by the target supply unit 26 and issue a signal indicating a trajectory detection error.

When the number of searches N is equal to or less than the upper limit value Nmax (S16: NO), the processor 5 advances processing to S17.

In S17, the processor 5 determines whether or not the flags related to processing of the first search and the second search are both invalid.

When the flags related to processing of the first search and the second search are both invalid (S17: YES), the processor 5 ends processing of the detection adjustment (see FIG. 5).

In a case where any one of the flags related to processing of the first search and the second search is valid (S17: NO), the processor 5 advances processing to S19.

In S19, the processor 5 determines whether or not the flag related to processing of the first search indicates valid.

When the flag related to processing of the first search indicates valid (S19: YES), the processor 5 advances processing to S20. In S20, the processor 5 performs processing of the first search. Details of the process of S20 will be described later with reference to FIG. 6. After S20, the processor 5 advances processing to S24.

When the flag related to processing of the first search indicates invalid (S19: NO), the processor 5 advances processing to S24 without performing processing of the first search.

In S24, the processor 5 determines whether or not the flag related to processing of the second search indicates valid.

When the flag related to processing of the second search indicates valid (S24: YES), the processor 5 advances processing to S25. In S25, the processor 5 performs processing of the second search. Details of the process of S25 will be described later with reference to FIG. 7. After S25, the processor 5 advances processing to S27.

When the flag related to processing of the second search indicates invalid (S24: NO), the processor 5 advances processing to S27 without performing processing of the second search.

In S27, the processor 5 updates the value of N by adding 1 to the value of the number of searches N. After S27, the processor 5 returns processing to S16.

By repeating the processes from S16 to S27, the first search and the second search are alternately performed.

When one of the flags of the first search and the second search is invalid and the other flag is valid, processing of the other is continuously performed.

3.2 First Search

Figure 6:
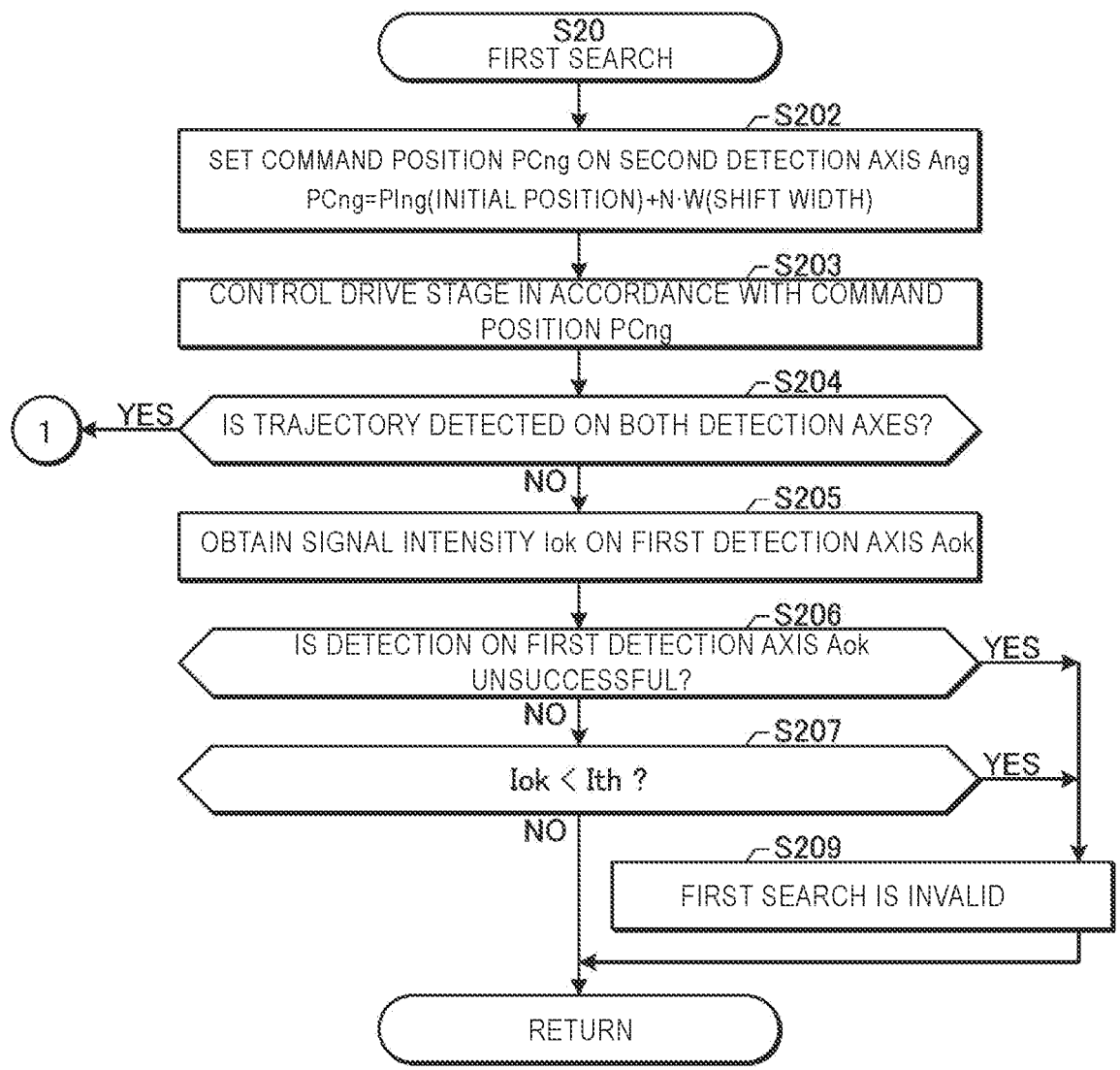
FIG. 6 is a flowchart illustrating details of processing of a first search in the first embodiment.

FIG. 6 is a flowchart illustrating details of processing of the first search in the first embodiment. The processing illustrated in FIG. 6 corresponds to the subroutine of S20 of FIG. 4. In S202, the processor 5 sets the command position PCng on the second detection axis Ang by following Equation (2).

$$PCng=PIng+N \cdot W \qquad (2)$$

In Equation (2), PIng is the initial position of the drive stage 26a on the second detection axis Ang. The initial position PIng has a value defined in the coordinate system of the drive stage 26a. It is preferable that, before controlling the drive stage 26a in the detection adjustment, the processor 5 obtains data of the current position PPng of the drive stage 26a and stores the obtained data as the initial position PIng in the memory 501 (see FIG. 1).

In Equation (2), W is a shift width indicating an amount of changing the position of the trajectory T along the second detection axis Ang in the detection adjustment. The shift width W is a positive number. If the shift width W is set too large, there is a possibility that the trajectory T jumps over the space Vxz when the position of the trajectory T is changed on the second detection axis Ang. It is desirable that the shift width W is, for example, equal to or less than the half of the dimension WZ or WX, along the second detection axis Ang, of the detection range Vz or Vx of the trajectory sensor that does not detect the trajectory T. On the other hand, if the shift width W is too small, there is a possibility that the trajectory T cannot reach the space Vxz unless the command position PCng is updated many times. The shift width W is, for example, 300 μm or more and 1500 μm or less. The shift width W is preferably 500 μm.

In S202, when the number of searches N is set to 1 (N=1), the command position PCng on the second detection axis Ang is set as follows according to Equation (2).

$$PCng=PIng+W$$

FIG. 9C illustrates an exemplary initial position PIng on the second detection axis Ang. FIG. 9E illustrates an example of the initial position PIng on the second detection axis Ang and the command position PCng in the first search when the number of searches N is set to 1. The command position PCng is obtained by adding the shift width W to the initial position PIng. The positive direction of the second detection axis Ang corresponds to a third direction in the present disclosure. For example, when the Z axis is the second detection axis Ang, the +Z direction corresponds to the third direction in the present disclosure.

Next, in S203, the processor 5 controls the drive stage 26a in accordance with the set command position PCng to move the trajectory T of the target 27 in the positive direction of the second detection axis Ang.

Next, in S204, the processor 5 determines whether or not the trajectory T of the target 27 can be detected on both the detection axes including not only the first detection axis Aok but also the second detection axis Ang.

When the control of the drive stage 26a in S203 enables the detection of the trajectory T on both the detection axes (S204: YES), the processor 5 advances processing to S28 of FIG. 5. In S28 of FIG. 5, the processor 5 starts the trajectory control based on the detection positions Pdok and Pdng on both the detection axes. After S28, the processor 5 ends processing of the detection adjustment, but output of the target 27 and the trajectory control continue thereafter.

If it is not possible to detect the trajectory T on both the detection axes (S204: NO), the processor 5 advances processing to S205.

In S205, the processor 5 obtains a signal intensity Iok on the first detection axis Aok. The signal intensity Iok on the first detection axis Aok is, for example, luminance at the position of the peak of the light intensity distribution extracted along the first detection axis Aok.

Next, in S206, the processor 5 determines whether or not the detection on the first detection axis Aok is not successful. For example, when the light intensity distribution extracted along the first detection axis Aok does not have a clear peak, the processor 5 determines that the detection on the first detection axis Aok is not successful.

When the detection on the first detection axis Aok is not successful (S206: YES), the processor 5 advances processing to S209.

When the detection on the first detection axis Aok is successful (S206: NO), the processor 5 advances processing to S207.

In S207, the processor 5 determines whether or not the signal intensity Iok on the first detection axis Aok is less than a threshold Ith. The threshold Ith is, for example, a predetermined value.

When the signal intensity Iok on the first detection axis Aok is less than the threshold Ith (S207: YES), the processor 5 advances processing to S209.

When the signal intensity Iok on the first detection axis Aok is equal to or greater than the threshold Ith (S207: NO), the processor 5 ends processing of the present flowchart, and returns to the processing illustrated in FIG. 4. FIG. 9F illustrates an exemplary light intensity distribution when the signal intensity Iok on the first detection axis Aok is equal to or greater than the threshold Ith. In this case, since the flag indicating that processing of the first search is valid is set, when the determination of S19 of FIG. 4 is performed again, processing of the first search is performed again as proceeding to S20.

In S209, the processor 5 sets a flag indicating that processing of the first search is invalid. Thereafter, the processor 5 ends processing of the present flowchart and returns to the processing illustrated in FIG. 4. Since the flag indicating that processing of the first search is invalid is set, processing of the first search is not performed thereafter.

As described above, in the first search, a value obtained by multiplying the number of searches N by the shift width W on the second detection axis Ang is added to the initial position PIng to calculate the command position PCng (S202). Then, the drive stage 26a is controlled to move the trajectory T of the target 27 in the positive direction of the second detection axis Ang (S203). As the number of searches N increases by the processing illustrated in FIG. 4, the command position PCng is set farther.

3.3 Second Search

Figure 7:
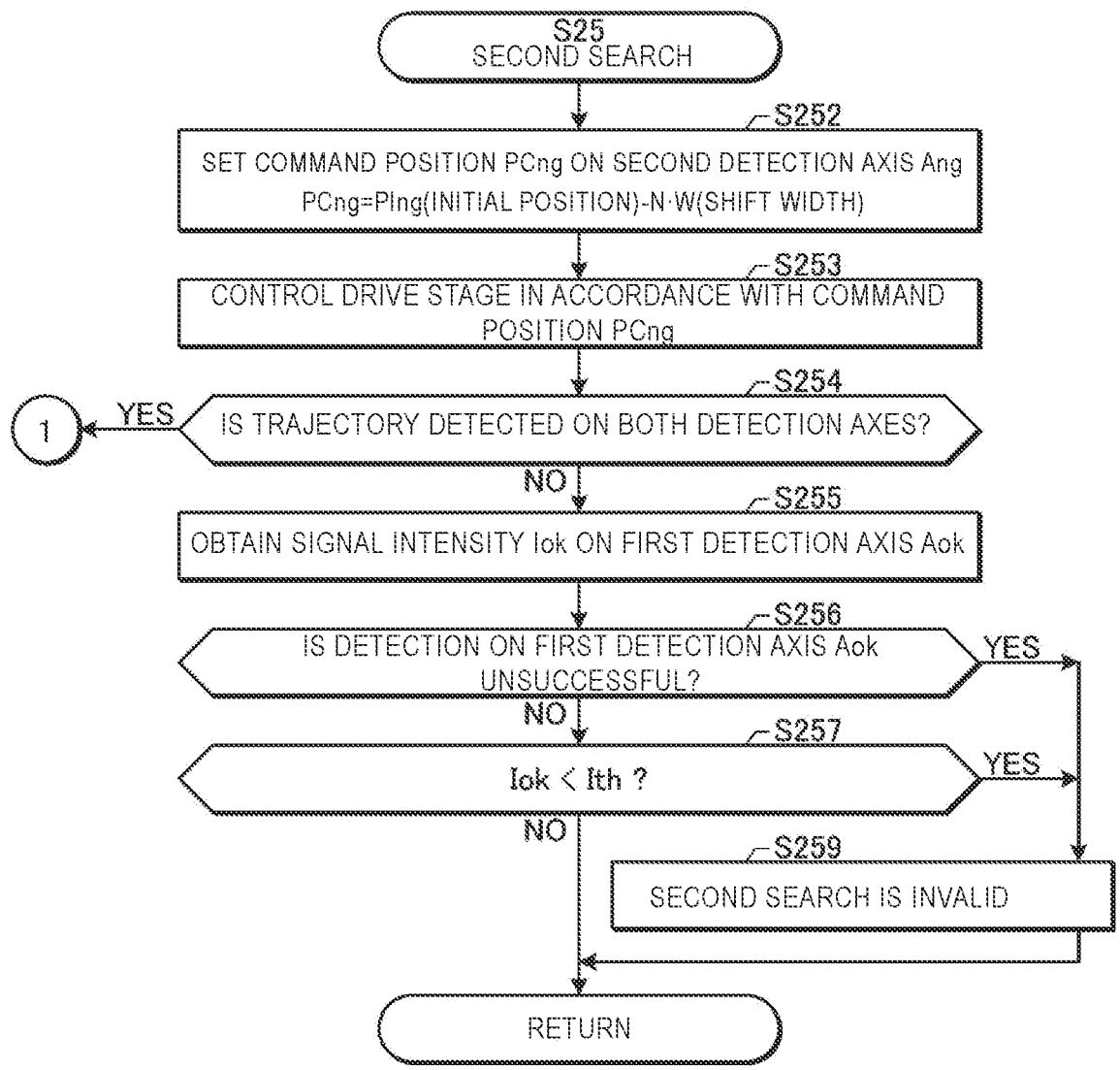
FIG. 7 is a flowchart illustrating details of processing of a second search in the first embodiment.

FIG. 7 is a flowchart illustrating details of processing of the second search in the first embodiment. The processing illustrated in FIG. 7 corresponds to the subroutine of S25 in FIG. 4.

In S252, the processor 5 sets the command position PCng on the second detection axis Ang by following Equation (3).

$$PCng=PIng-N \cdot W \qquad (3)$$

In Equation (3), a value obtained by multiplying the number of searches N by the shift width W is subtracted from the initial position PIng.

In S252, when the number of searches N is set to 1 (N=1), the command position PCng on the second detection axis Ang is set as follows according to Equation (3).

$$PCng = PIng - W$$

FIG. 9G illustrates an example of the initial position PIng on the second detection axis Ang and the command position PCng in the second search when the number of searches N is set to 1. The negative direction opposite to the positive direction of the second detection axis Ang corresponds to a fourth direction in the present disclosure. For example, when the Z axis is the second detection axis Ang, −Z direction corresponds to the fourth direction in the present disclosure.

In other respects, the second search is the same as the first search described with reference to FIG. 6. That is, the processes from S253 to S259 are different from the processes from S203 to S209 in that the second search in the opposite direction to the first search is performed, but is the same in other respects.

As described above, in the second search, the command position PCng is calculated by subtracting, from the initial position PIng, the value obtained by multiplying the number of searches N by the shift width W in the second detection axis Ang (S252). Then, the drive stage 26a is controlled to move the trajectory T of the target 27 in the negative direction of the second detection axis Ang (S253). As the number of searches N increases by the processing illustrated in FIG. 4, the command position PCng is set farther.

Further, the processor 5 determines whether or not the trajectory T of the target 27 can be detected on both the detection axes including not only the first detection axis Aok but also the second detection axis Ang (S254). When the trajectory T on both the detection axes can be detected (S245: YES), the processor 5 advances processing to S28 of FIG. 5.

In addition, the processor 5 determines whether or not the signal intensity Iok on the first detection axis Aok is less than the threshold Ith (S257). FIG. 9H illustrates an exemplary light intensity distribution when the signal intensity Iok on the first detection axis Aok is less than the threshold Ith. When the signal intensity Iok on the first detection axis Aok is less than the threshold Ith, in S259, the processor 5 sets a flag indicating that processing of the second search is invalid. Thereafter, the processor 5 ends processing of the present flowchart and returns to the processing illustrated in FIG. 4. Since the flag indicating that processing of the second search is invalid is set, processing of the second search is not performed thereafter.

3.4 when Either One of Flags Becomes Invalid

As described with reference to FIG. 4, when one of the flags of the first search and the second search becomes invalid, processing of the other is continuously performed.

FIG. 9I illustrates an example of the initial position PIng on the second detection axis Ang and the command position PCng in the first search when the number of searches N is set to 2. The command position PCng is obtained by adding twice the shift width W to the initial position PIng.

FIG. 9J illustrates an exemplary light intensity distribution when the signal intensity Iok on the first detection axis Aok is equal to or greater than the threshold Ith. When the signal intensity Iok on the first detection axis Aok is equal to or greater than the threshold Ith (S207: NO), since the flag indicating that processing of the first search is valid is set, processing of the first search is performed again for performing the determination of S19 of FIG. 4 again.

FIG. 9K illustrates an example of the initial position PIng on the second detection axis Ang and the command position PCng in the first search when the number of searches N is set to 3. The command position PCng is obtained by adding three times the shift width W to the initial position PIng.

When the trajectory T on both the detection axes can be detected (S204: YES), the processor 5 advances processing to S28 of FIG. 5. FIG. 9L illustrates an exemplary light intensity distribution when the trajectory T becomes detectable on the second detection axis Ang. As illustrated in FIG. 9L, even though the signal intensity is not high, the detection position Pdng of the trajectory T can be detected if there is a clear peak in the light intensity distribution.

In S28 of FIG. 5, the processor 5 starts the trajectory control based on the detection positions Pdok and Pdng on both the detection axes. According to the trajectory control, the drive stage 26a is controlled so that the trajectory T of the target 27 detected on the second detection axis Ang approaches the target position Ptng. FIG. 9M illustrates an exemplary light intensity distribution when the trajectory T of the target 27 along the second detection axis Ang is brought close to the target position Ptng.

3.5 Effect

In the first embodiment, the first search and the second search are performed alternately, and it is determined whether or not the trajectory T of the target 27 can be detected on both the detection axes including the second detection axis Ang. However, the trajectory T of the target 27 approaches the ideal trajectory only in one of the first search and the second search, and the other thereof is a search in a wrong direction. When the drive stage 26a is moved greatly in the wrong direction, there is a possibility that the trajectory T is moved to a position such that the target 27 cannot be collected by the target collection unit 28. If the target 27 cannot be collected, there is a possibility that the inside of the chamber 2 is contaminated by the target substance.

Figure 8:
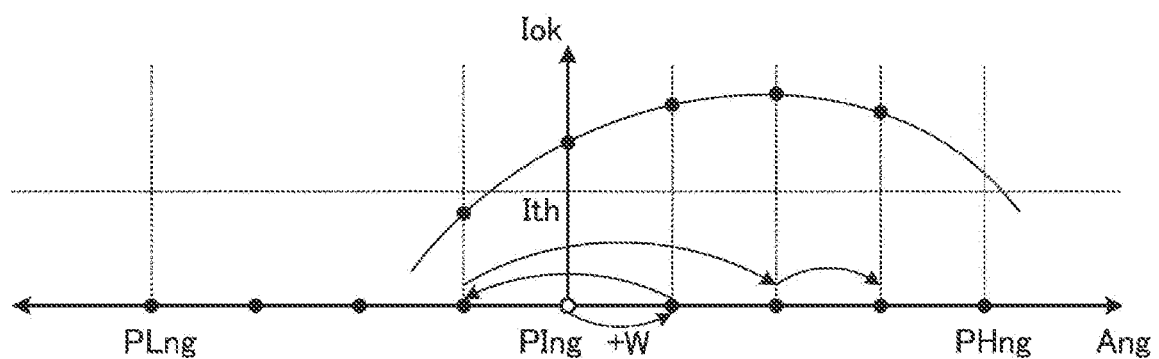
FIG. 8 is a graph illustrating an example of the signal intensity on a first detection axis when the first search and the second search are performed along a second detection axis in the first embodiment.

FIG. 8 is a graph illustrating an example of the signal intensity Iok on the first detection axis Aok when the first search and the second search are performed along the second detection axis Ang in the first embodiment. Moving the drive stage 26a along the second detection axis Ang also changes the signal intensity Iok on the first detection axis Aok. For example, when the signal intensity Iok on the first detection axis Aok is decreased by moving the drive stage 26a in the negative direction along the second detection axis Ang, there is a possibility that the trajectory T is moved in a direction away from the peak position Ppeak of the light intensity distribution of the illumination light 43. When the signal intensity Iok decreases in this way, it can be determined that the search is performed in the wrong direction even before the drive stage 26a reaches an upper limit PHng or a lower limit PLng of the movable range thereof.

According to the first embodiment, for example, when the X-axis trajectory sensor 4x detects the trajectory T of the target 27 and the Z-axis trajectory sensor 4z does not detect the trajectory T of the target 27, the first search is performed. Then, based on the signal intensity Iok of the X-axis trajectory sensor 4x, it is determined whether or not to repeat the first search. Accordingly, even when the Z-axis trajectory sensor 4z does not detect the trajectory T of the target 27, it can be appropriately determined whether or not to repeat the first search. Then, the EUV light generation apparatus 1 can be operated without the readjustment and start-up process by an operator.

According to the first embodiment, the first search and the second search are performed alternately. Then, for example, it is determined whether or not to repeat the first search based on the signal intensity Iok of the X-axis trajectory sensor 4x obtained in the first search, and it is determined whether or not to repeat the second search based on the signal intensity Iok of the X-axis trajectory sensor 4x obtained in the second search. Accordingly, even when either of the first search and the second search is a search in a wrong direction, the trajectory T of the target 27 can be moved to a position that can be detected by the Z-axis trajectory sensor 4z.

According to the first embodiment, the negative direction in which the second search is performed is opposite to the positive direction in which the first search is performed. Accordingly, there is a high possibility that either the first search or the second search is a search in the correct direction.

According to the first embodiment, when it is determined that the second search is to be repeated after it is determined that the first search is not to be repeated, the second search is continuously performed. Alternatively, when it is determined that the first search is to be repeated after it is determined that the second search is not to be repeated, the first search is continuously performed. This makes it possible to efficiently perform the search in the correct direction.

According to the first embodiment, when the number of the first searches N exceeds the upper limit value Nmax, it is determined that the first search is not to be repeated. Accordingly, even when it cannot be determined that the first search is a search in a wrong direction based on the signal intensity Iok of the X-axis trajectory sensor 4x, it is possible to prevent the drive stage 26a from being excessively moved.

According to the first embodiment, for example, when the X-axis trajectory sensor 4x does not detect the trajectory T of the target 27, it is determined that the first search is not to be repeated. Accordingly, it is possible to appropriately determine that the first search is a search in a wrong direction.

According to the first embodiment, for example, when the signal intensity Iok of the X-axis trajectory sensor 4x is less than the threshold Ith, it is determined that the first search is not to be repeated. Accordingly, even when the X-axis trajectory sensor 4x detects the trajectory T of the target 27, it is possible to early determine that the first search is a search in a wrong direction.

According to the first embodiment, a predetermined value is set as the threshold Ith. Accordingly, it is possible to determine that the first search is a search in a wrong direction on a stable criterion.

4. EUV Light Generation Apparatus Performing Second Search After Continuously Performing First Search

4.1 Operation

Figure 10:
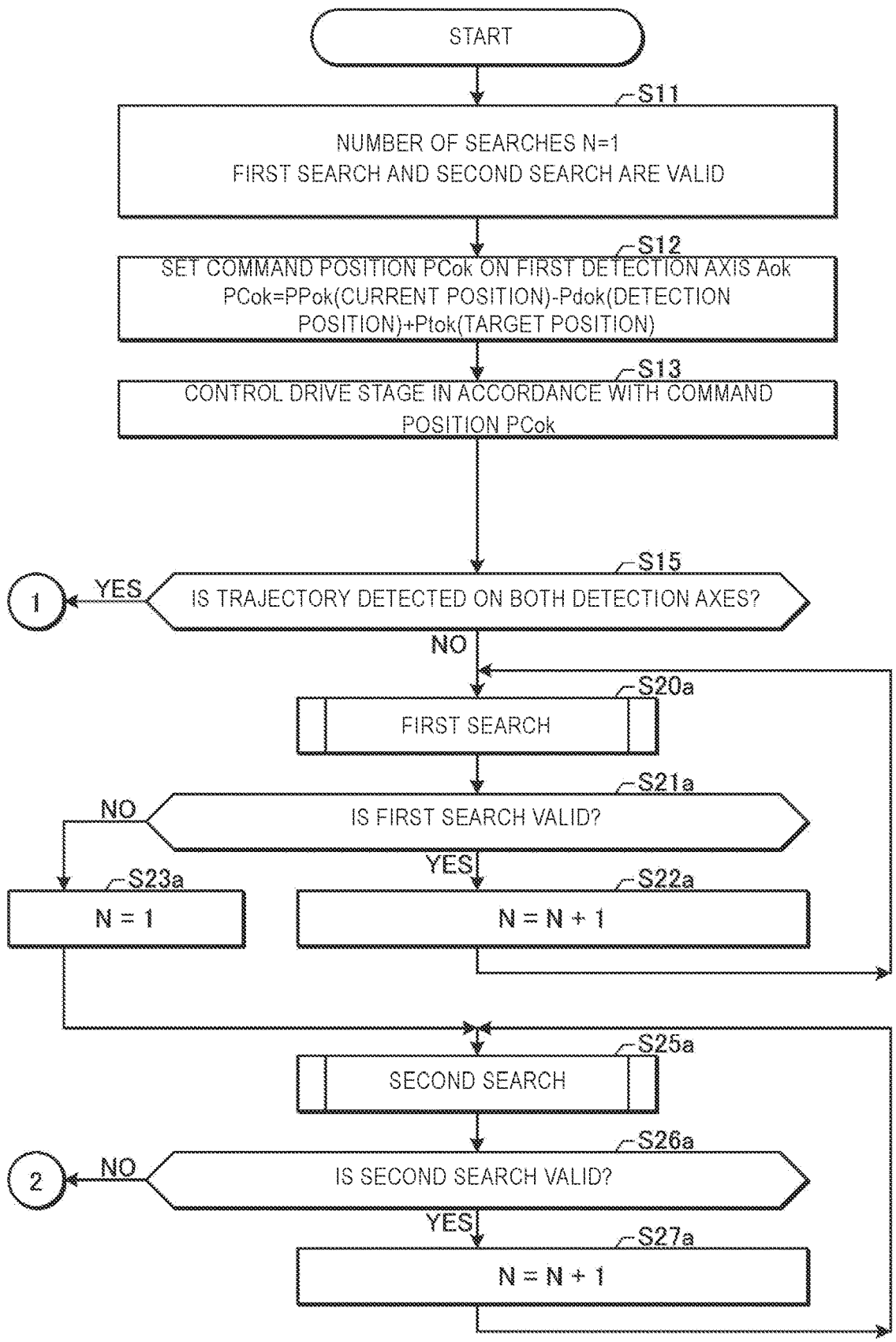
FIG. 10 is a flowchart illustrating operation of a main part of the detection adjustment in a second embodiment.

FIG. 10 is a flowchart illustrating operation of a main part of the detection adjustment in a second embodiment. The structural configuration of the EUV light generation apparatus 1 according to the second embodiment is the same as the configuration of the comparative example described with reference to FIGS. 2 and 3A to 3D. The end operation of the detection adjustment in the second embodiment is the same as that described with reference to FIG. 5. In the first embodiment, the first search and the second search are alternately performed, whereas the second embodiment is different from the first embodiment in that the second search is performed after the first search is continuously performed.

The processes from S11 to S15 are the same as the corresponding processes in the first embodiment described with reference to FIG. 4.

After S15, the processor 5 performs processing of the first search in S20a.

Figure 11:
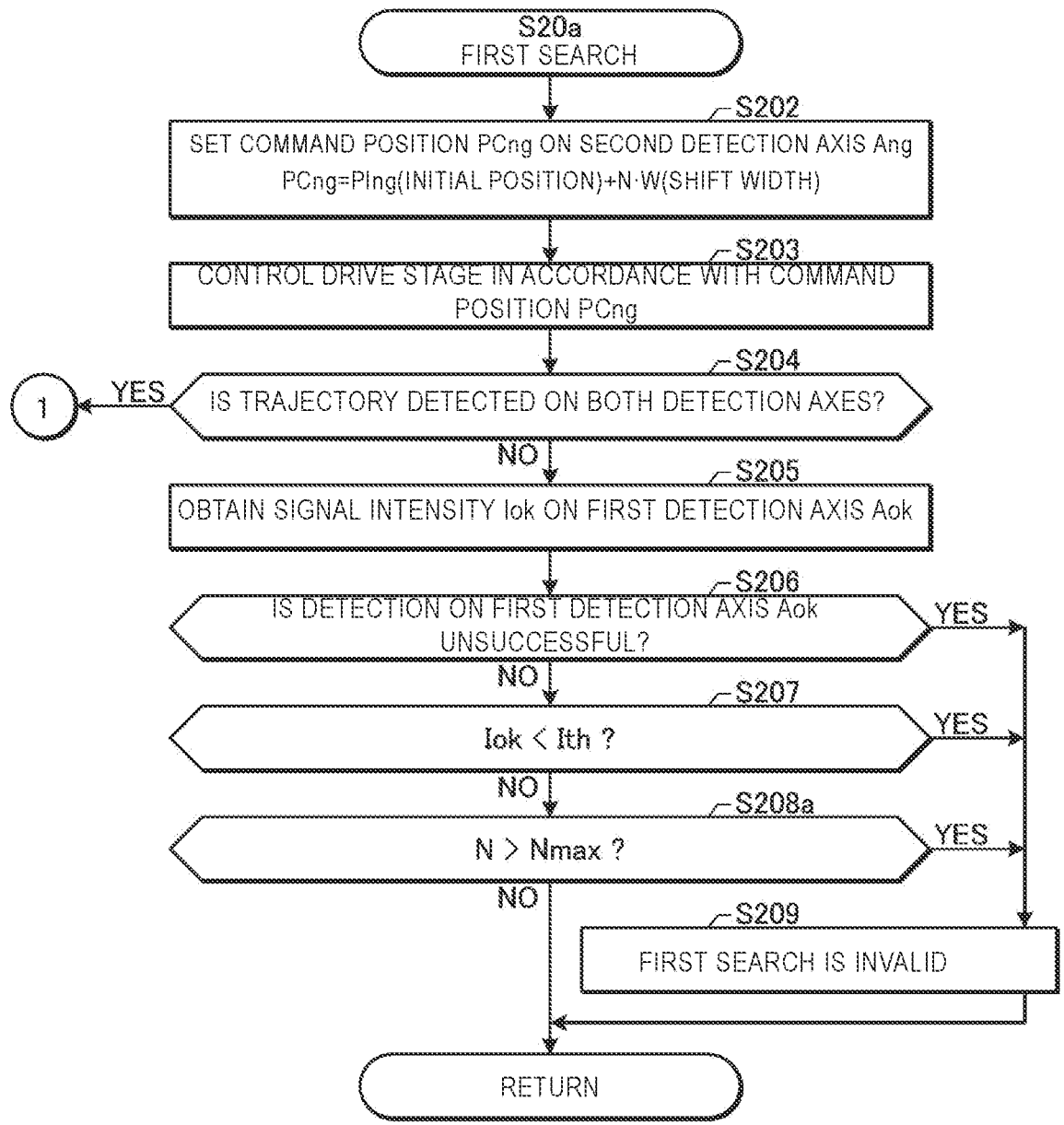
FIG. 11 is a flowchart illustrating details of processing of the first search in the second embodiment.

FIG. 11 is a flowchart illustrating details of processing of the first search in the second embodiment. The processing illustrated in FIG. 11 corresponds to the subroutine of S20a in FIG. 10. The processing illustrated in FIG. 11 is different from the processing illustrated in FIG. 6 in that the process of S208a is added after the determination of "NO" is made in S207. In S208a, the processor 5 determines whether or not the number of searches N exceeds the upper limit value Nmax.

When the number of searches N exceeds the upper limit value Nmax (S208a: YES), the processor 5 advances processing to S209.

When the number of searches N is equal to or less than the upper limit value Nmax (S208a: NO), the processor 5 ends processing of the flowchart and returns to the processing illustrated in FIG. 10.

Referring again to FIG. 10, after S20a, in S21a, the processor 5 determines whether or not the flag related to processing of the first search indicates that the flag is valid.

When the flag related to processing of the first search indicates valid (S21a: YES), the processor 5 advances processing to S22a. In S22a, the processor 5 updates the value of N by adding 1 to the value of the number of searches N. After S22a, the processor 5 returns processing to S20a.

When the flag related to processing of the first search indicates invalid (S21a: NO), the processor 5 advances processing to S23a. In S23a, the processor 5 returns the number of searches N to the initial value 1.

Figure 12:
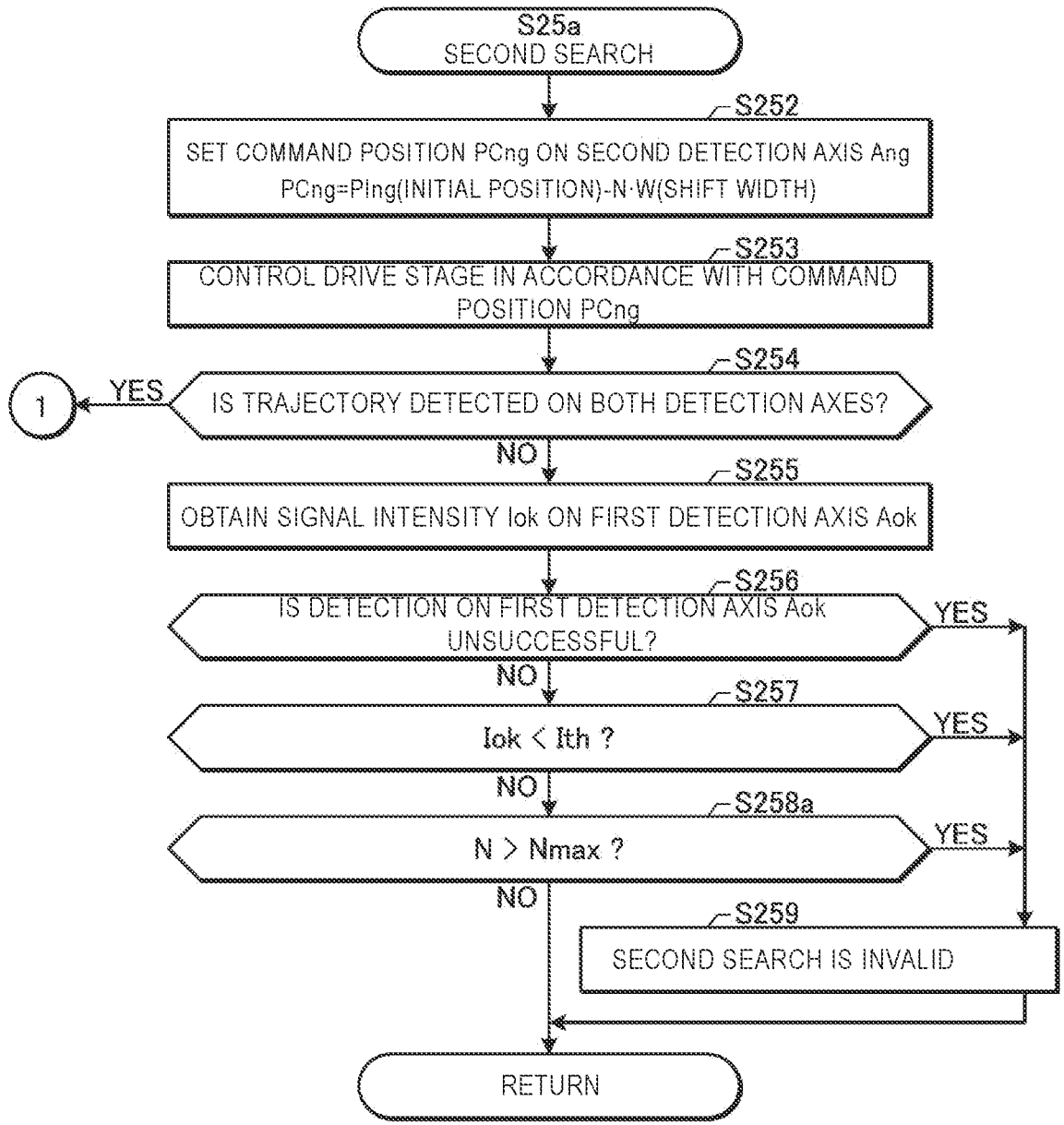
FIG. 12 is a flowchart illustrating details of processing of the second search in the second embodiment.

After S23a, the processor 5 performs processing of the second search in S25a. FIG. 12 is a flowchart illustrating details of processing of the second search in the second embodiment.

The processing illustrated in FIG. 12 corresponds to the subroutine of S25a in FIG. 10. The processing illustrated in FIG. 12 is different from the processing illustrated in FIG. 7 in that the process of S258a is added after the determination of "NO" is made in S257. In S258a, the processor 5 determines whether or not the number of searches N exceeds the upper limit value Nmax.

When the number of searches N exceeds the upper limit value Nmax (S258a: YES), the processor 5 advances the processing to S259.

When the number of searches N is equal to or less than the upper limit value Nmax (S258a: NO), the processor 5 ends processing of the flowchart and returns to the processing illustrated in FIG. 10.

Referring again to FIG. 10, after S25a, in S26a, the processor 5 determines whether or not the flag related to processing of the second search indicates valid.

When the flag related to processing of the second search indicates valid (S26a: YES), the processor 5 advances processing to S27a. In S27a, the processor 5 updates the value of N by adding 1 to the value of the number of searches N. After S27a, the processor 5 returns processing to S25a.

When the flag related to processing of the second search is invalid (S26a: NO), the processor 5 ends processing of the detection adjustment (see FIG. 5).

As described above, after the first search is repeated a predetermined number of times in S20a, when the number of searches N exceeds the upper limit value Nmax in S208a, or when the condition of S206 or S207 is satisfied, the number of searches N is returned to the initial value 1 in S23a. Then, after the second search is repeated a predetermined number of times in S25a, when the number of searches N exceeds the upper limit value Nmax in S258a or when the condition of S256 or S257 is satisfied, processing of the detection adjustment is ended.

In other respects, the operation of the second embodiment is the same as that of the first embodiment.

4.2 Effect

Figure 13:
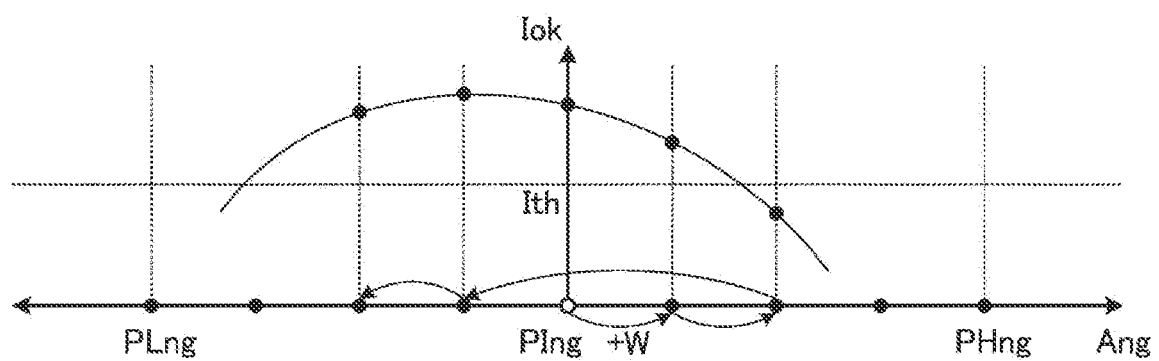
FIG. 13 is a graph illustrating an example of the signal intensity on the first detection axis when the first search and the second search are performed along the second detection axis in the second embodiment.

FIG. 13 is a graph illustrating an example of the signal intensity Iok on the first detection axis Aok when the first search and the second search are performed along the second detection axis Ang in the second embodiment. In the second embodiment, the first search for controlling the drive stage 26a in the positive direction is continuously performed, and then the second search for controlling the drive stage 26a in the negative direction is continuously performed. Moving the drive stage 26a along the second detection axis Ang also changes the signal intensity Iok on the first detection axis Aok. For example, when the signal intensity Iok on the first detection axis Aok is decreased by moving the drive stage 26a in the positive direction along the second detection axis Ang, there is a possibility that the trajectory T is moved in a direction away from the peak position Ppeak of the light intensity distribution of the illumination light 43. When the signal intensity Iok decreases in this way, it can be determined that the search is performed in the wrong direction even before the drive stage 26a reaches the upper limit PHng or the lower limit PLng of the movable range thereof.

According to the second embodiment, when it is determined that the first search is to be repeated, the first search is continuously performed. Thereafter, when it is determined that the first search is not to be repeated, the second search is performed. According to the above, there may be a case that the amount of movement of the drive stage 26a is smaller than that in the case where the first search and the second search are alternately performed. It is also possible to determine whether or not the trajectory T of the target 27 can be detected while slowly moving the drive stage 26a without completely stopping the drive stage 26a at the command position PCng every N times of search.

In other respects, the operation of the second embodiment is the same as that of the first embodiment.

Figure 14:
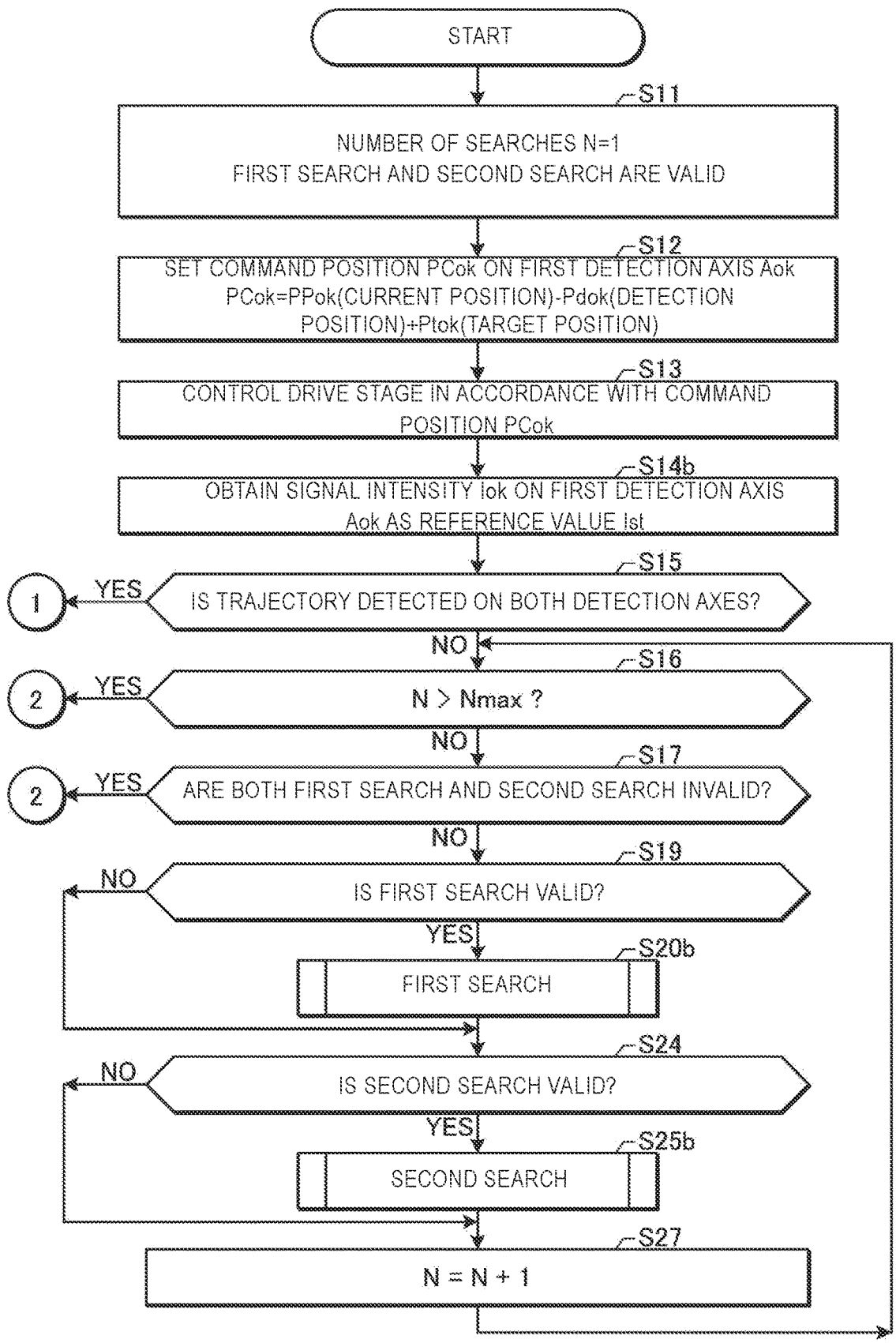
FIG. 14 is a flowchart illustrating operation of a main part of the detection adjustment in a third embodiment.

5. EUV Light Generation Apparatus Determining Threshold Using Signal Intensity at Initial Position as Reference Value 5.1 Operation FIG. 14 is a flowchart illustrating operation of a main part of the detection adjustment in a third embodiment. The structural configuration of the EUV light generation apparatus 1 according to the third embodiment is the same as the configuration of the comparative example described referring to FIGS. 2 and 3A to 3D. The end operation of the detection adjustment in the third embodiment is the same as that described with reference to FIG. 5. In the first embodiment, a predetermined value is set as the threshold Ith, whereas the third embodiment is different from the first embodiment in that the signal intensity Iok when the drive stage 26a is at the initial position PIng is set as the reference value Ist, and the threshold Ith is determined based on the reference value Ist.

The processes from S11 to S13 are the same as the corresponding processes in the first embodiment described with reference to FIG. 4.

After S13, in S14b, the processor 5 obtains the signal intensity Iok on the first detection axis Aok as the reference value Ist. Since the first search and the second search have not yet been performed in S14b, the reference value Ist corresponds to the signal intensity Iok when the drive stage 26a is at the initial position PIng on the second detection axis Ang, and the reference value Ist corresponds to the initial value of the signal intensity Iok.

The processes from S15 to S27 after S14b are the same as the corresponding processes in the first embodiment described with reference to FIG. 4. However, details of processing of the first search S20b and the second search S25b are partially different from the corresponding processing in the first embodiment.

Figure 15:
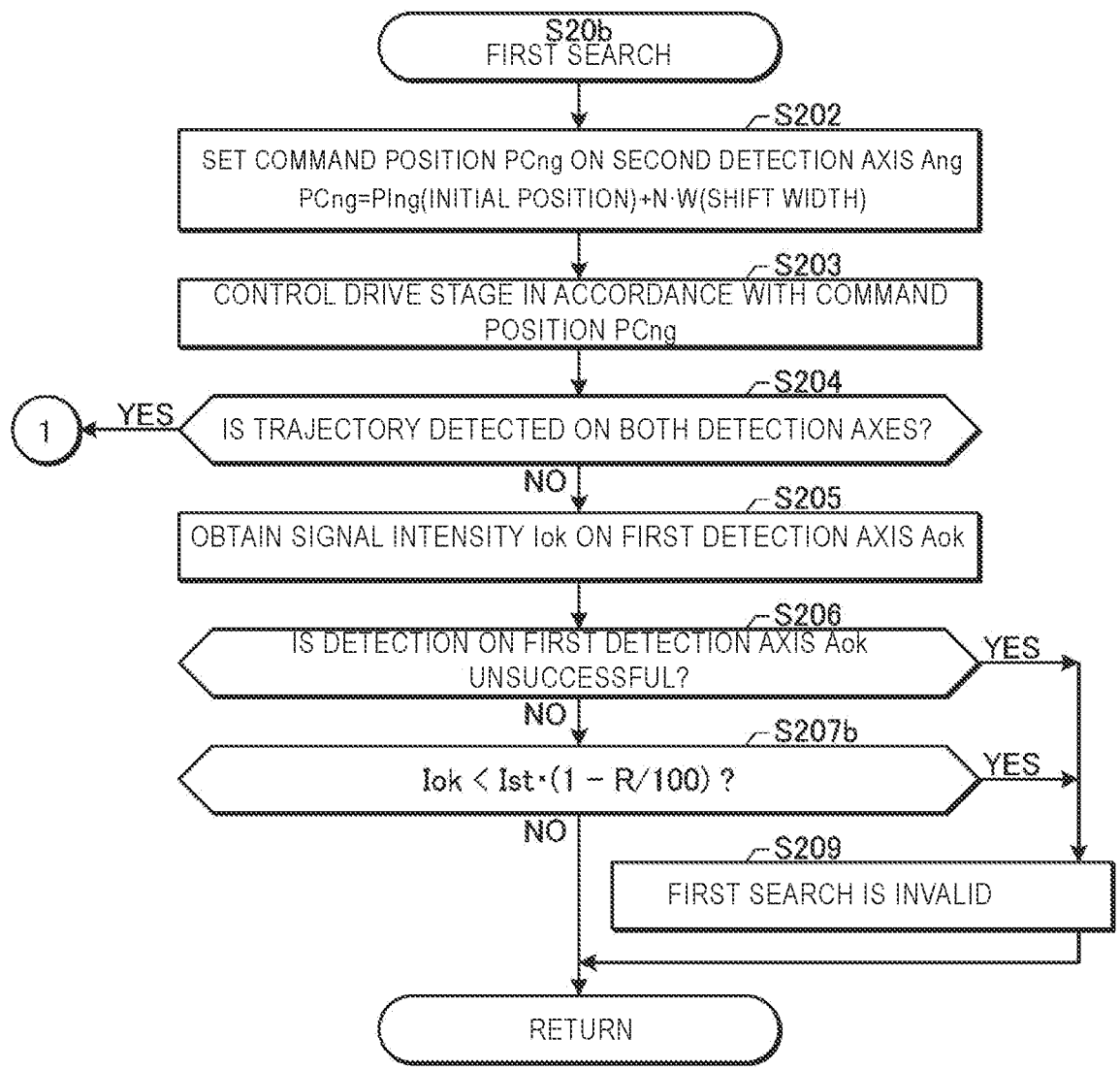
FIG. 15 is a flowchart illustrating details of processing of the first search in the third embodiment.

FIG. 15 is a flowchart illustrating details of processing of the first search in the third embodiment. The processing illustrated in FIG. 15 corresponds to the subroutine of S20b in FIG. 14. The processing illustrated in FIG. 15 differs from the processing illustrated in FIG. 6 in that S207b is performed instead of S207 of FIG. 6. In S207b, the processor 5 determines whether or not the signal intensity Iok on the first detection axis Aok is less than a threshold Ith defined by the following equation.

$$Ith = Ist \cdot (1 - R/100)$$

Here, R is a number greater than 0 and less than 100. The threshold Ith in the third embodiment corresponds to a value obtained by setting the initial value of the signal intensity Iok as the reference value Ist and decreasing the reference value Ist by a predetermined ratio. In order to determine whether or not there is a significant difference between the reference value Ist and the signal intensity Iok, R is preferably set to a value larger than 30.

Alternatively, the threshold Ith may be defined by the following equation.

$$Ith = Ist - \alpha$$

Here, α is a predetermined number greater than 0.

Figure 16:
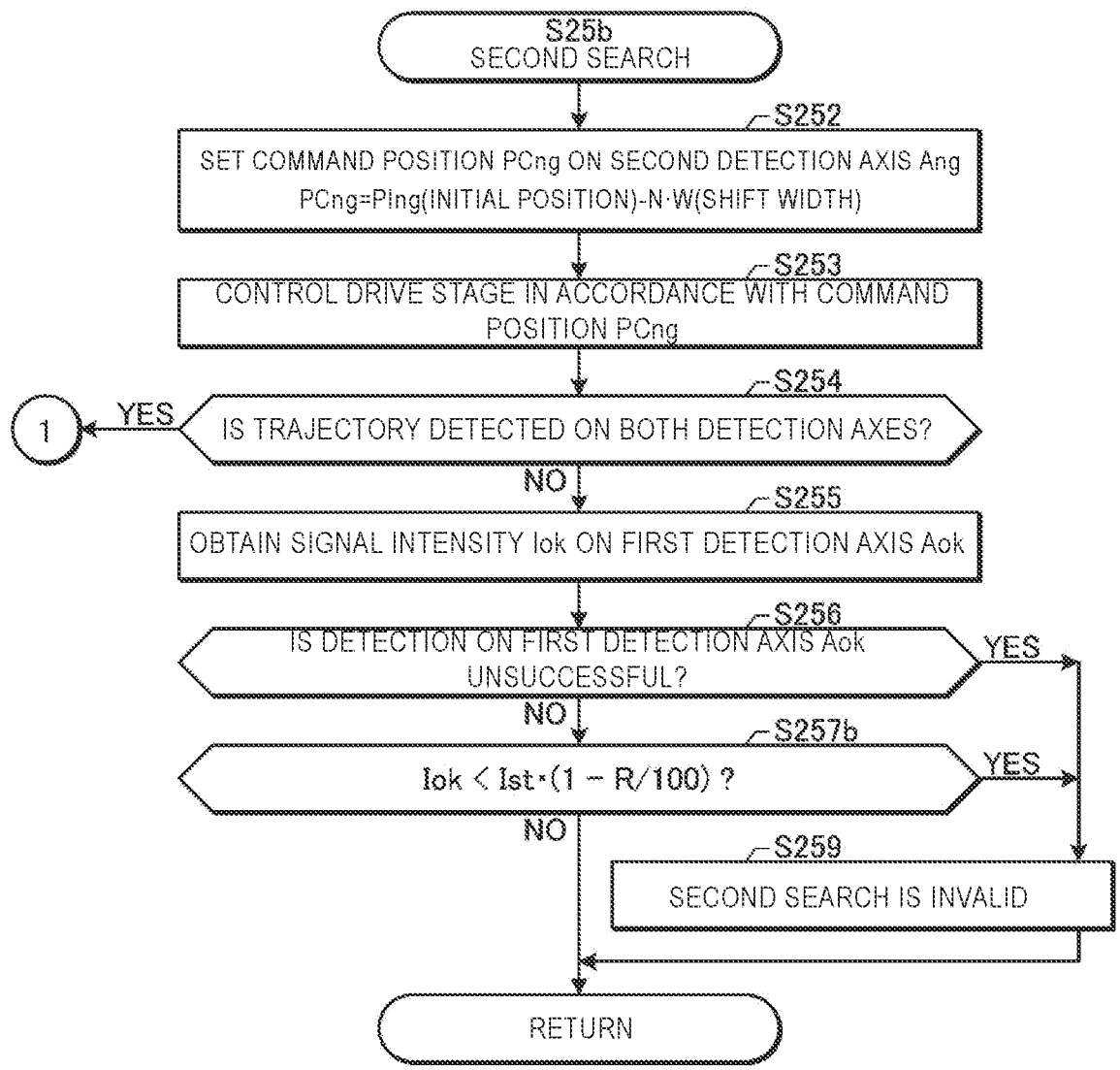
FIG. 16 is a flowchart illustrating details of processing of the second search in the third embodiment.

FIG. 16 is a flowchart illustrating details of processing of the second search in the third embodiment. The processing illustrated in FIG. 16 corresponds to the subroutine of S25b in FIG. 14. The processing illustrated in FIG. 16 differs from the processing illustrated in FIG. 7 in that S257b is performed instead of S257 of FIG. 7. The process of S257b is the same as the process of S207b described above.

In other respects, the operation of the third embodiment is the same as that of the first embodiment.

Alternatively, in the third embodiment, similarly to the second embodiment, the second search may be performed after the first search is continuously performed.

5.2 Effect

Figure 17:
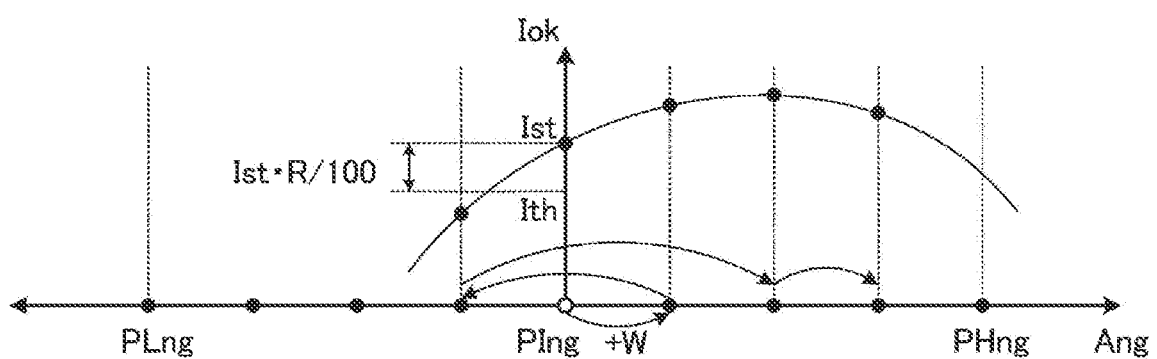
FIG. 17 is a graph illustrating an example of the signal intensity on the first detection axis when the first search and the second search are performed along the second detection axis in the third embodiment.

FIG. 17 is a graph illustrating an example of the signal intensity Iok on the first detection axis Aok when the first search and the second search are performed along the second detection axis Ang in the third embodiment. In the third embodiment, the threshold Ith has a value obtained by setting the initial value of the signal intensity Iok when the drive stage 26a is at the initial position PIng on the second detection axis Ang as the reference value Ist and decreasing the reference value Ist by a predetermined ratio. The processor 5 determines whether or not to repeat the first search or the second search based on whether or not the signal intensity Iok on the first detection axis Aok is less than the threshold Ith.

According to the third embodiment, the signal intensity Iok of the X-axis trajectory sensor 4x before the first search is performed is set as the reference value Ist, and the threshold Ith is determined based on the reference value Ist. Accordingly, it is possible to determine whether or not the signal intensity Iok is decreased depending on whether or not there is a significant difference between the reference value Ist and the signal intensity Iok, and it is possible to appropriately determine whether or not to repeat the first search.

According to the third embodiment, a value obtained by decreasing the reference value Ist by a predetermined ratio is set as the threshold Ith. Accordingly, for example, when alignment of the initial position PIng is appropriate, the reference value Ist can also be a high value, so that the threshold Ith can also be a high value, and the number of searches N can be suppressed from increasing.

In other respects, the operation of the third embodiment is the same as that of the first embodiment.

6. EUV Light Generation Apparatus Updating Reference Value

6.1 Operation

Figure 18:
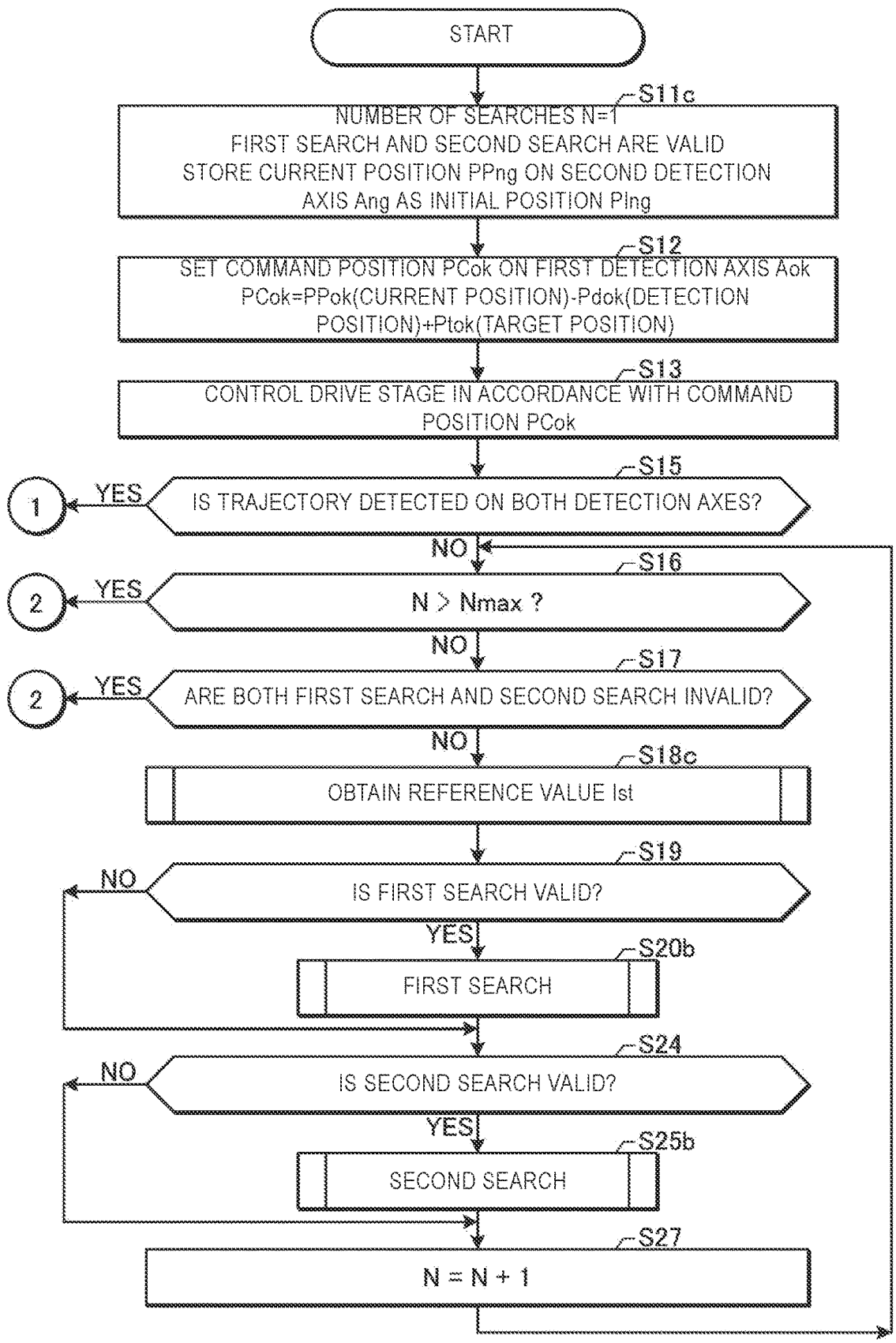
FIG. 18 is a flowchart illustrating operation of a main part of the detection adjustment in a fourth embodiment.

FIG. 18 is a flowchart illustrating operation of a main part of the detection adjustment in a fourth embodiment. The structural configuration of the EUV light generation apparatus 1 according to the fourth embodiment is the same as the configuration of the comparative example described with reference to FIGS. 2 and 3A to 3D. The end operation of the detection adjustment in the fourth embodiment is the same as that described with reference to FIG. 5. In the third embodiment, the reference value Ist is not updated when the first search or the second search is repeated, whereas the fourth embodiment is different from the third embodiment in that the reference value Ist is updated when the first search or the second search is repeated. The processing illustrated in FIG. 18 differs from the processing illustrated in FIG. 14 in that S11c is performed instead of S11 of FIG. 14 and S18c is performed between S17 and S19 instead of S14b of FIG. 14.

In S11c, the processor 5 sets the number of searches N to an initial value 1, sets flags indicating that processing of the first search and processing of the second search are valid, and stores the current position PPng of the drive stage 26a on the second detection axis Ang as the initial position PIng. In the present disclosure, when the drive stage 26a is at the initial position PIng before the first search and the second search are performed, the target supply unit 26 is at the reference position.

In S18c, the processor 5 controls the drive stage 26a to the initial position PIng, and obtains the signal intensity Iok on the first detection axis Aok to obtain the reference value Ist.

Figure 19:
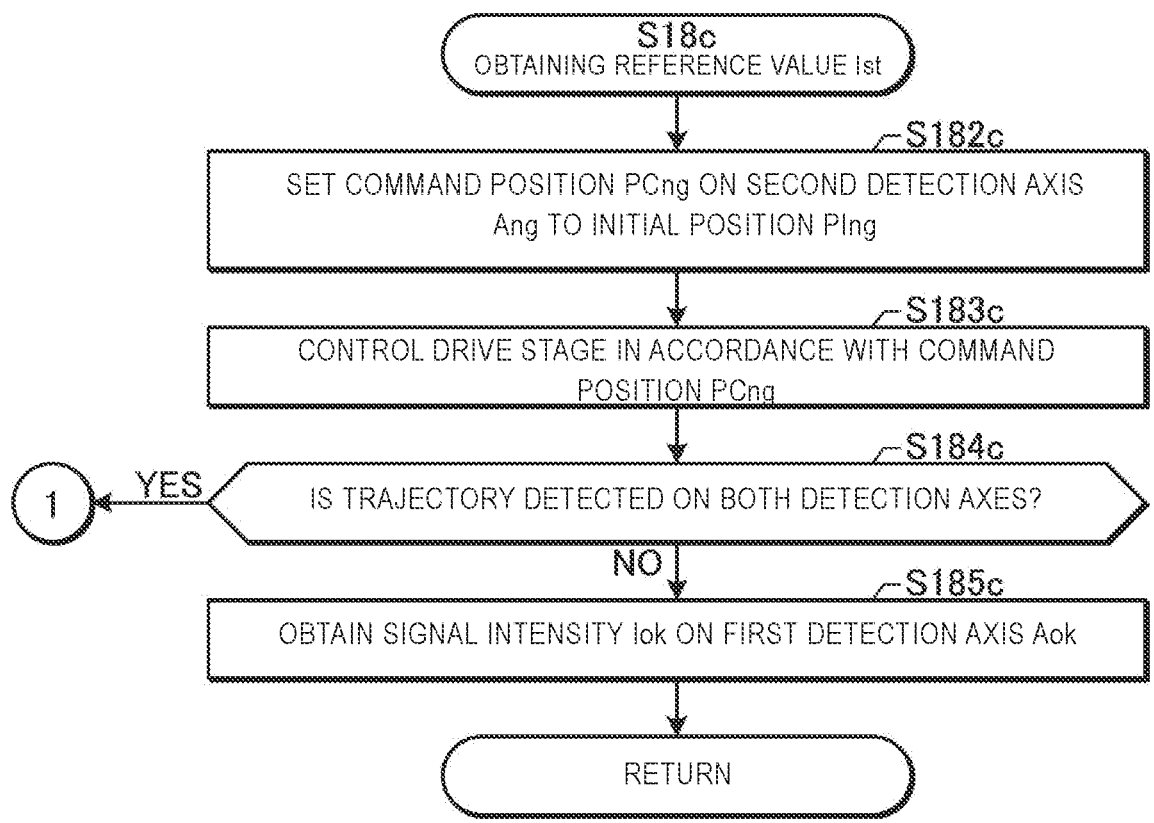
FIG. 19 is a flowchart illustrating details of processing for obtaining a reference value in the fourth embodiment.

FIG. 19 is a flowchart illustrating details of processing for obtaining the reference value Ist in the fourth embodiment. The processing illustrated in FIG. 19 corresponds to the subroutine of S18c in FIG. 18.

In S182c, the processor 5 sets the command position PCng on the second detection axis Ang to the initial position PIng stored in S11c.

Next, in S183c, the processor 5 controls the drive stage 26a in accordance with the set command position PCng.

Next, in S184c, the processor 5 determines whether or not the trajectory T of the target 27 can be detected on both the detection axes including not only the first detection axis Aok but also the second detection axis Ang.

When the trajectory T on both the detection axes can be detected (S184c: YES), the processor 5 advances processing to S28 of FIG. 5.

If it is not possible to detect the trajectory T on both detection axes (S184c: NO), the processor 5 advances processing to S185c.

In S185c, the processor 5 obtains the reference value Ist by obtaining the signal intensity Iok on the first detection axis Aok.

Thereafter, the processor 5 ends processing of the flowchart, and returns to the processing illustrated in FIG. 18.

The reference value Ist obtained in S18c when the number of searches N is set to 1 is a value equivalent to the initial value of the signal intensity Iok described in the third embodiment. However, in the fourth embodiment, the reference value Ist is newly obtained in S18c each time the first search and the second search are performed. The reference value Ist obtained in S18c when the number of searches N is 2 or more may be a value different from the initial value of the signal intensity Iok described in the third embodiment.

In other respects, the operation of the fourth embodiment is the same as that of the third embodiment.

6.2 Effect

Figure 20:
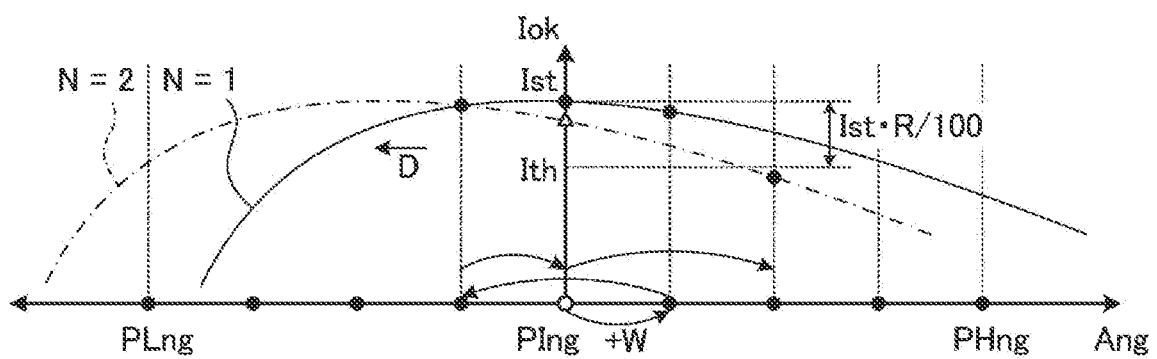
FIG. 20 is a graph illustrating an example of the signal intensity on the first detection axis when the first search and the second search are performed along the second detection axis in the fourth embodiment.

FIG. 20 is a graph illustrating an example of the signal intensity Iok on the first detection axis Aok when the first search and the second search are performed along the second detection axis Ang in the fourth embodiment. The trajectory T of the target 27 is likely to fluctuate particularly immediately after outputting of the target 27 is started. For example, the curve of the graph when the number of searches N is set to 2 (N=2) may be shifted in the direction of an arrow D with respect to the curve of the graph when the number of searches N is set to 1 (N=1). In this case, if the reference value Ist when the number of searches N is set to 1 is used as it is to determine whether or not to further repeat the search when the number of searches N is set to 2, there is a possibility that an appropriate determination result is not obtained.

For example, even when the signal intensity Iok becomes lower than the threshold Ith calculated using the reference value Ist when the number of searches N is set to 1, the signal intensity Iok may not be lower than the threshold Ith by applying the reference value obtained again when the number of searches N is set to 2.

According to the fourth embodiment, when the first search is repeated, the drive stage 26a is controlled to the initial position PIng so that the target supply unit 26 moves to the reference position, and the signal intensity Iok of the X-axis trajectory sensor 4x is newly obtained. Then, having the newly obtained signal intensity Iok as the reference value Ist, the threshold Ith is determined based on the reference value Ist. The reference position is the position of the target supply unit 26 before the first search is firstly performed. This makes it possible to appropriately determine whether or not to repeat the first search even when the trajectory T of the target 27 changes as the number of searches N increases.

In other respects, the operation of the fourth embodiment is the same as that of the third embodiment.

7. EUV Light Generation Apparatus Using Average Value

7.1 Operation

Figure 21:
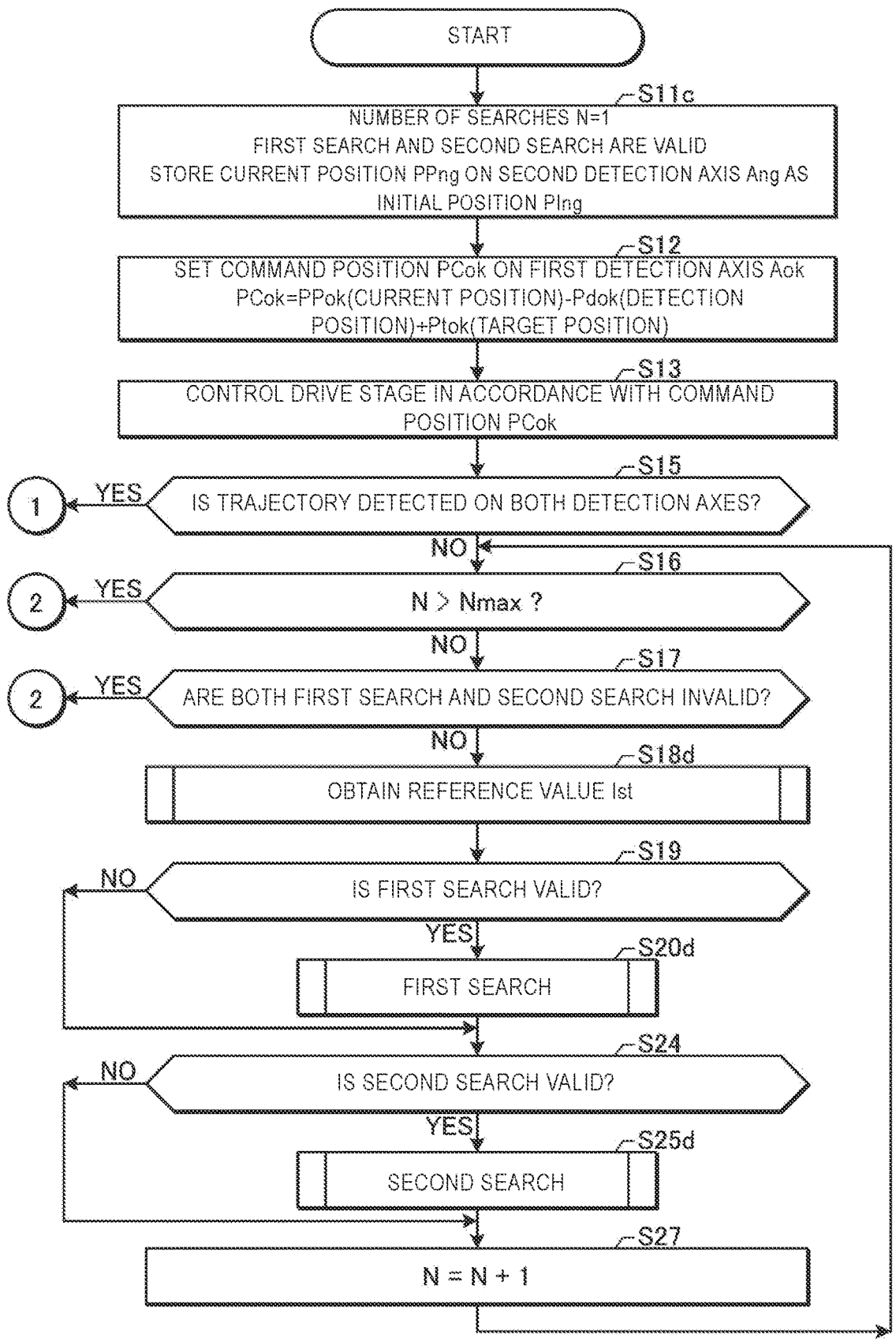
FIG. 21 is a flowchart illustrating operation of a main part of the detection adjustment in a fifth embodiment.

FIG. 21 is a flowchart illustrating operation of a main part of the detection adjustment in a fifth embodiment. The structural configuration of the EUV light generation apparatus 1 according to the fifth embodiment is the same as the configuration of the comparative example described with reference to FIGS. 2 and 3A to 3D. The end operation of the detection adjustment in the fifth embodiment is the same as that described with reference to FIG. 5. The fifth embodiment is different from the fourth embodiment in that an average value of the signal intensities Iok is used as the reference value Ist. The processing illustrated in FIG. 21 differs in that S18d, S20d, and S25d are performed instead of S18c, S20b, and S25b of FIG. 18. S18d, S20d, and S25d are described below with reference to FIGS. 22 to 24.

Figure 22:
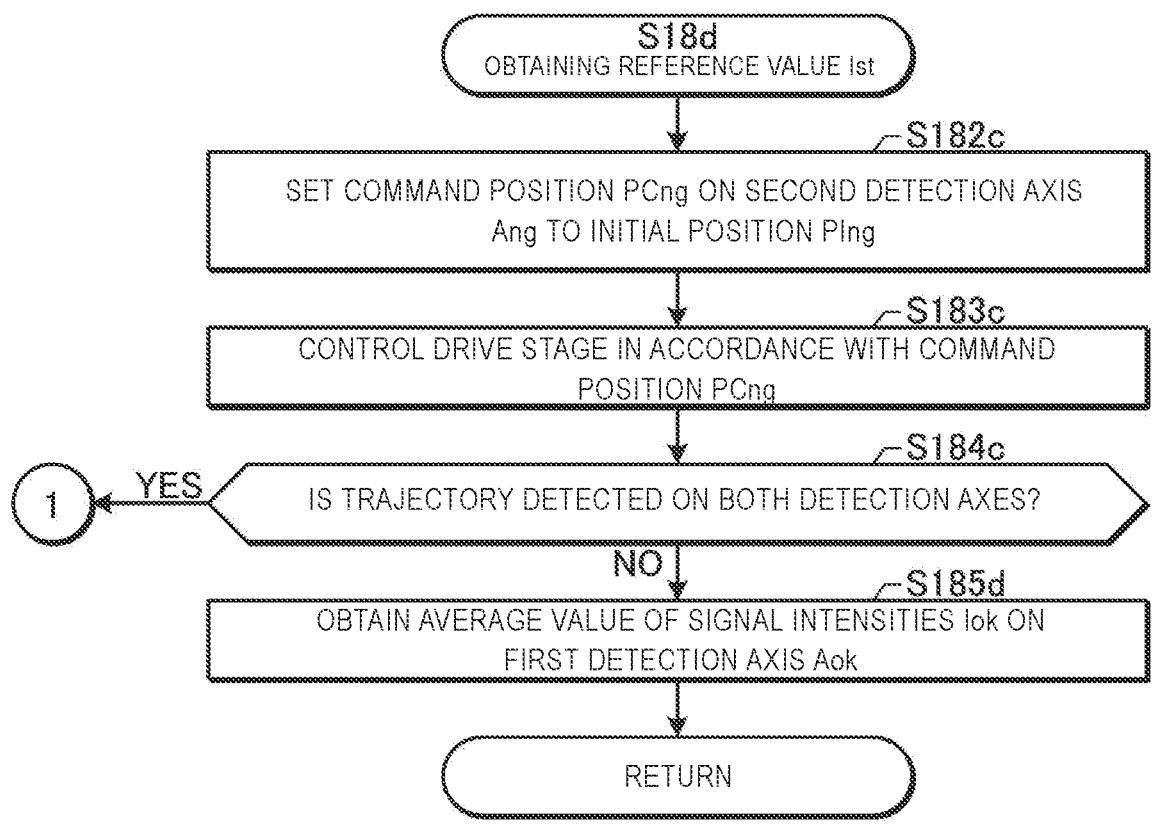
FIG. 22 is a flowchart illustrating details of processing for obtaining a reference value in the fifth embodiment.

FIG. 22 is a flowchart illustrating details of processing for obtaining the reference value Ist in the fifth embodiment. The processing illustrated in FIG. 22 corresponds to the subroutine of S18d of FIG. 21. The processing illustrated in FIG. 22 differs from the processing illustrated in FIG. 19 in that S185d is performed instead of S185c of FIG. 19. In S185d, the processor 5 obtains a reference value Ist by obtaining the average value of the signal intensities Iok of a predetermined number of pulses on the first detection axis Aok.

Figure 23:
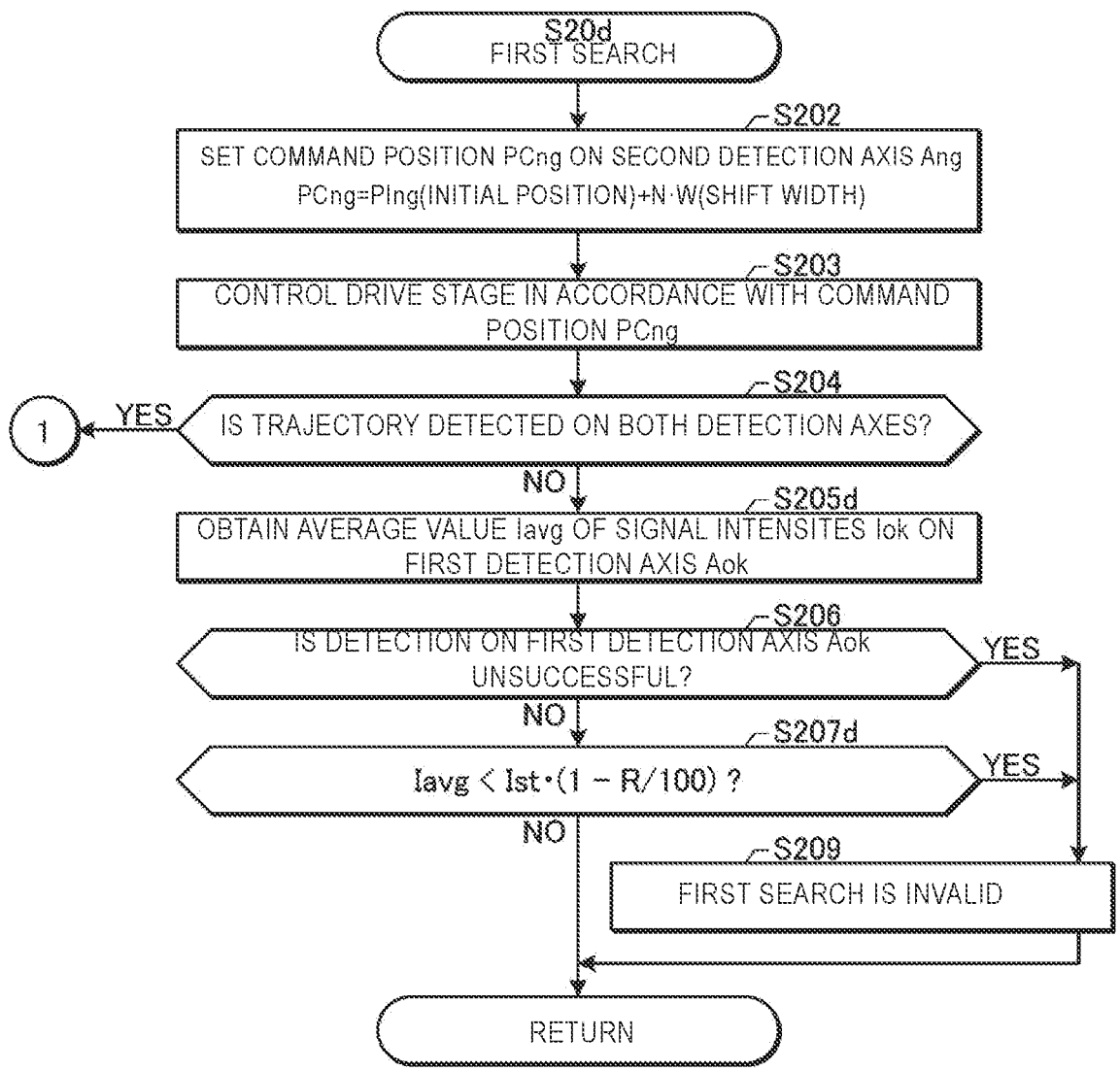
FIG. 23 is a flowchart illustrating details of processing of the first search in the fifth embodiment.

FIG. 23 is a flowchart illustrating details of processing of the first search in the fifth embodiment. The processing illustrated in FIG. 23 corresponds to the subroutine of S20d of FIG. 21. The processing illustrated in FIG. 23 differs from the processing illustrated in FIG. 15 in that S205d and S207d are performed instead of S205 and S207b of FIG. 15.

In S205d, the processor 5 obtains the average value Iavg of the signal intensities Iok on the first detection axis Aok of the predetermined number of pulses.

In S207d, the processor 5 determines whether or not the average value Iavg of the signal intensities Iok on the first detection axis Aok of the predetermined number of pulses is less than the threshold Ith.

$$Ith = Ist \cdot (1 - R/100)$$

Figure 24:
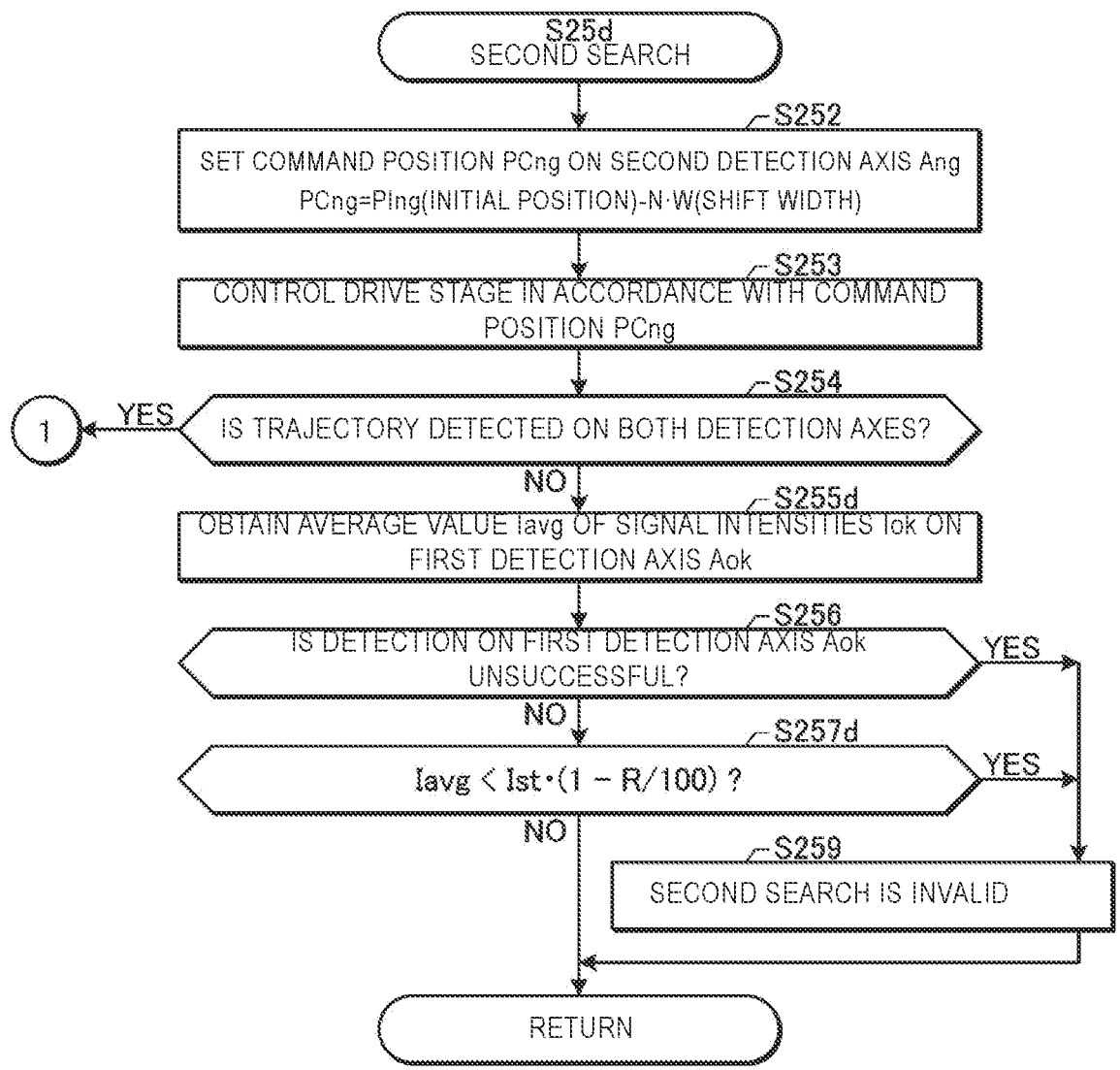
FIG. 24 is a flowchart illustrating details of processing of the second search in the fifth embodiment.

FIG. 24 is a flowchart illustrating details of processing of the second search in the fifth embodiment. The processing illustrated in FIG. 24 corresponds to the subroutine of S25d of FIG. 21. The processing illustrated in FIG. 24 differs from the processing illustrated in FIG. 16 in that S255d and S257d are performed instead of S255 and S257b of FIG. 16. The processes of S255d and S257d are the same as the processes of S205d and S207d described with reference to FIG. 23. In other respects, the operation of the fifth embodiment is the same as that of the fourth embodiment.

7.2 Effect

According to the fifth embodiment, for example, the average value of the signal intensities Iok of the plurality of pulses included in the signal output from the X-axis trajectory sensor 4x is set as the reference value Ist. Accordingly, even when the trajectory T of the target 27 fluctuates in a short time, or even when there is a variation in the measurement result without high measurement accuracy of the signal intensity Iok, an appropriate reference value Ist can be set.

According to the fifth embodiment, for example, when the average value Iavg of the signal intensities Iok of the plurality of pulses included in the signal output from the X-axis trajectory sensor 4x is less than the threshold Ith, it is determined that the first search is not to be repeated. Accordingly, even when the trajectory T of the target 27 fluctuates in a short time or when there is a variation in the measurement result without high measurement accuracy of the signal intensity Iok, it is possible to appropriately determine whether or not to repeat the first search.

In other respects, the effect of the fifth embodiment is the same as that of the fourth embodiment.

8. Others

Figure 25:
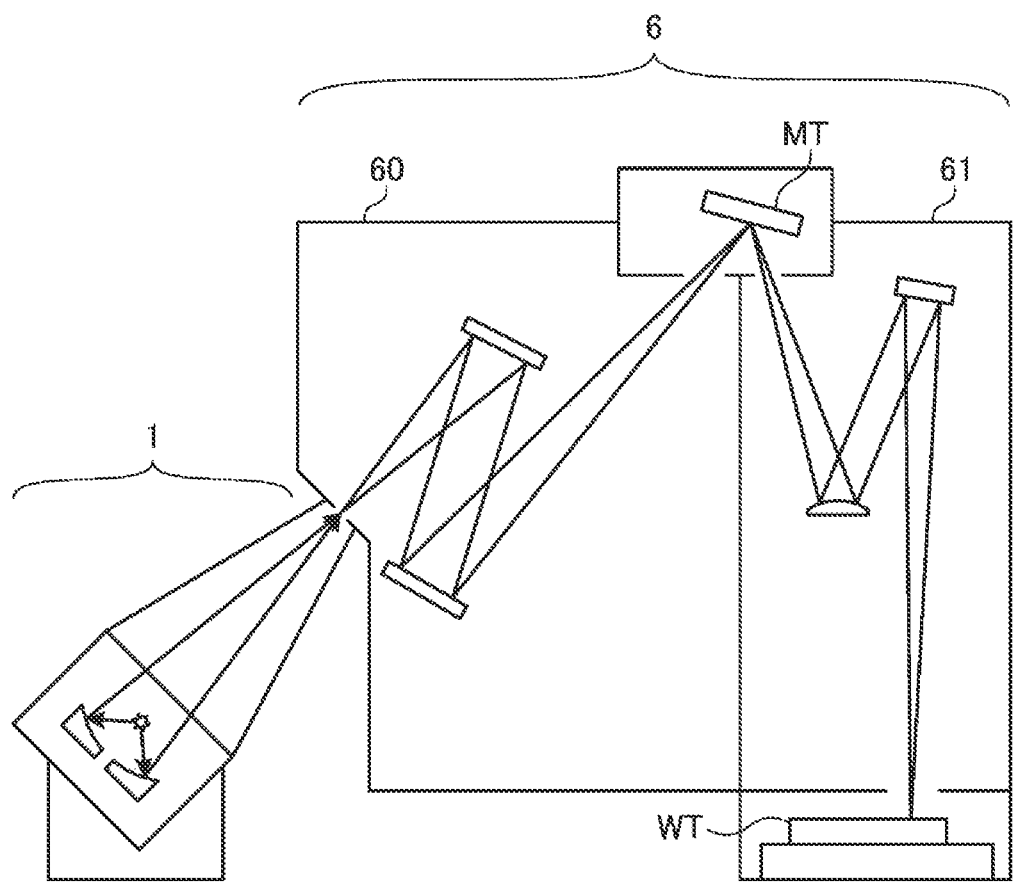
FIG. 25 schematically illustrates a configuration of an exposure apparatus connected to an EUV light generation apparatus.

FIG. 25 schematically illustrates a configuration of the exposure apparatus 6 connected to the EUV light generation apparatus 1.

In FIG. 25, the exposure apparatus 6 includes a mask irradiation unit 60 and a workpiece irradiation unit 61. The mask irradiation unit 60 illuminates the mask pattern of the mask table MT with the EUV light incident from the EUV light generation apparatus 1 via the reflection optical system. The workpiece irradiation unit 61 images the EUV light reflected by the mask table MT onto a workpiece (not illustrated) disposed on the workpiece table WT through the reflection optical system. The workpiece is a photosensitive substrate such as a semiconductor wafer on which photoresist is applied. The exposure apparatus 6 synchronously translates the mask table MT and the workpiece table WT to expose the workpiece to the EUV light reflecting the mask pattern. Through the exposure process as described above, a device pattern is transferred onto the semiconductor wafer, thereby an electronic device can be manufactured.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. An extreme ultraviolet light generation apparatus configured to generate extreme ultraviolet light by irradiating a target with laser light, comprising:
    a target supply unit configured to output the target;
    an actuator configured to change a trajectory of the target;
    an illumination device configured to illuminate the target;
    a first trajectory sensor configured to detect the trajectory of the target in a first direction;
    a second trajectory sensor configured to detect the trajectory of the target in a second direction being different from the first direction; and
    a processor configured, when the trajectory of the target is detected by the first trajectory sensor but is not detected by the second trajectory sensor, to perform a first search and determine whether or not to repeat the first search based on a signal intensity of the first trajectory sensor, the first search including changing the trajectory of the target into a third direction being different from the second direction by controlling the actuator, and then determining whether or not the second trajectory sensor is capable of detecting the trajectory of the target.

2. The extreme ultraviolet light generation apparatus according to claim 1,
    wherein the processor alternately performs the first search and a second search, determines whether or not to repeat the first search based on the signal intensity of the first trajectory sensor obtained in the first search, and determines whether or not to repeat the second search based on a signal intensity of the first trajectory sensor obtained in the second search, the second search including changing the trajectory of the target into a fourth direction being different from the third direction by controlling the actuator, and then determining whether or not the second trajectory sensor is capable of detecting the trajectory of the target.

3. The extreme ultraviolet light generation apparatus according to claim 2,
wherein the fourth direction is opposite to the third direction.

4. The extreme ultraviolet light generation apparatus according to claim 2,
wherein the processor continuously performs the second search when the processor determines to repeat the second search after determining not to repeat the first search.

5. The extreme ultraviolet light generation apparatus according to claim 2,
wherein the processor continuously performs the first search when the processor determines to repeat the first search after determining not to repeat the second search.

6. The extreme ultraviolet light generation apparatus according to claim 1,
wherein the processor continuously performs the first search when the processor determines to repeat the first search.

7. The extreme ultraviolet light generation apparatus according to claim 6,
wherein, when the processor determines not to repeat the first search, the processor performs a second search and determines whether or not to repeat the second search based on the signal intensity of the first trajectory sensor, the second search including changing the trajectory of the target into a fourth direction being different from the third direction by controlling the actuator, and then determining whether or not the second trajectory sensor is capable of detecting the trajectory of the target.

8. The extreme ultraviolet light generation apparatus according to claim 1,
wherein, when the trajectory of the target is detected by both the first trajectory sensor and the second trajectory sensor, the processor controls the actuator so that the trajectory of the target detected by the first trajectory sensor and the trajectory of the target detected by the second trajectory sensor approach corresponding target positions respectively.

9. The extreme ultraviolet light generation apparatus according to claim 1,
wherein the processor determines not to repeat the first search when the number of the first searches exceeds an upper limit.

10. The extreme ultraviolet light generation apparatus according to claim 1,
wherein the processor determines not to repeat the first search when the trajectory of the target is not detected by the first trajectory sensor.

11. The extreme ultraviolet light generation apparatus according to claim 1,
wherein the processor determines not to repeat the first search when the signal intensity is less than a threshold.

12. The extreme ultraviolet light generation apparatus according to claim 11,
wherein the processor sets a predetermined value as the threshold.

13. The extreme ultraviolet light generation apparatus according to claim 11,
wherein the processor determines the threshold based on a reference value, the reference value being the signal intensity of the first trajectory sensor before the first search is performed.

14. The extreme ultraviolet light generation apparatus according to claim 13,
wherein the processor sets, as the threshold, a value obtained by decreasing the reference value by a predetermined ratio.

15. The extreme ultraviolet light generation apparatus according to claim 11,
wherein the actuator is configured to change the trajectory of the target by moving the target supply unit, and
when repeating the first search, the processor controls the actuator so that the target supply unit is moved to a reference position, newly obtains a signal intensity of the first trajectory sensor, and determines the threshold based on a reference value being the newly obtained signal intensity.

16. The extreme ultraviolet light generation apparatus according to claim 15,
wherein the processor sets, as the reference position, a position of the target supply unit before the first search is firstly performed.

17. The extreme ultraviolet light generation apparatus according to claim 15,
wherein the processor sets, as the reference value, an average value of signal intensities of a plurality of pulses included in a signal output from the first trajectory sensor.

18. The extreme ultraviolet light generation apparatus according to claim 1,
wherein the processor determines not to repeat the first search when an average value of signal intensities of a plurality of pulses included in a signal output from the first trajectory sensor is less than a threshold.

19. A target control method with an extreme ultraviolet light generation apparatus configured to generate extreme ultraviolet light by irradiating a target with laser light, the method comprising:
determining whether or not a trajectory of the target is detected by a first trajectory sensor and a second trajectory sensor; and
when the trajectory of the target is detected by the first trajectory sensor but is not detected by the second trajectory sensor, performing a first search and determining whether or not to repeat the first search based on a signal intensity of the first trajectory sensor,
the first search including changing the trajectory of the target into a third direction being different from a second direction by controlling an actuator, and then determining whether or not the second trajectory sensor is capable of detecting the trajectory of the target, and
the extreme ultraviolet light generation apparatus including:
a target supply unit configured to output the target;
the actuator configured to change the trajectory of the target;
an illumination device configured to illuminate the target;
the first trajectory sensor configured to detect the trajectory of the target in a first direction; and the second trajectory sensor configured to detect the trajectory of the target in the second direction being different from the first direction.

20. An electronic device manufacturing method, comprising:
  generating extreme ultraviolet light by irradiating a target with laser light using an extreme ultraviolet light generation apparatus;
  emitting the extreme ultraviolet light to an exposure apparatus; and
  exposing a photosensitive substrate to the extreme ultraviolet light in the exposure apparatus to manufacture an electronic device,
  the extreme ultraviolet light generation apparatus including:
  a target supply unit configured to output the target;
  an actuator configured to change a trajectory of the target;
  an illumination device configured to illuminate the target;
  a first trajectory sensor configured to detect the trajectory of the target in a first direction;
  a second trajectory sensor configured to detect the trajectory of the target in a second direction being different from the first direction; and
  a processor configured, when the trajectory of the target is detected by the first trajectory sensor but is not detected by the second trajectory sensor, to perform a first search and determine whether or not to repeat the first search based on a signal intensity of the first trajectory sensor, the first search including changing the trajectory of the target into a third direction being different from the second direction by controlling the actuator, and then determining whether or not the second trajectory sensor is capable of detecting the trajectory of the target.

* * * * *